(12) United States Patent
Kai

(10) Patent No.: US 7,705,412 B2
(45) Date of Patent: Apr. 27, 2010

(54) SOI SUBSTRATE AND SEMICONDUCTOR ACCELERATION SENSOR USING THE SAME

(75) Inventor: Takayuki Kai, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/222,807

(22) Filed: Aug. 15, 2008

(65) Prior Publication Data

US 2009/0115006 A1 May 7, 2009

(30) Foreign Application Priority Data

Aug. 17, 2007 (JP) ............................. 2007-212622

(51) Int. Cl.
*H01L 29/84* (2006.01)
(52) U.S. Cl. ................. 257/417; 257/418; 257/419; 257/E29.324
(58) Field of Classification Search ................. 257/417, 257/418, 419, E29.324
See application file for complete search history.

(56) References Cited

U.S. PATENT DOCUMENTS

| | | | | |
|---|---|---|---|---|
| 5,320,705 A | * | 6/1994 | Fujii et al. .................... | 438/51 |
| 6,484,578 B2 | * | 11/2002 | Woodruff et al. ......... | 73/514.29 |
| 6,892,578 B2 | * | 5/2005 | Saitoh et al. .............. | 73/514.33 |
| 2004/0226373 A1 | * | 11/2004 | Sakaguchi ................ | 73/514.16 |
| 2006/0130580 A1 | * | 6/2006 | Ikegami ................... | 73/514.01 |
| 2007/0089514 A1 | * | 4/2007 | Takeyari et al. .......... | 73/514.33 |
| 2007/0199191 A1 | * | 8/2007 | Sakamoto ..................... | 29/595 |
| 2009/0159997 A1 | * | 6/2009 | Okudo et al. ................ | 257/415 |

FOREIGN PATENT DOCUMENTS

JP        07-225240        8/1995

* cited by examiner

*Primary Examiner*—Ngan Ngo
(74) *Attorney, Agent, or Firm*—Rabin & Berdo, PC

(57) ABSTRACT

According to the present invention, a SOI substrate includes a first silicon substrate having first and second surfaces; a second silicon substrate having first and second surfaces; and a first insulating layer formed between first surface of the first silicon substrate and the first surface of the second silicon substrates. The first surface of the first silicon substrate is partly depressed to form a thin-layer region thereat. The first insulating layer is formed at least in the thin-layer region.

2 Claims, 25 Drawing Sheets

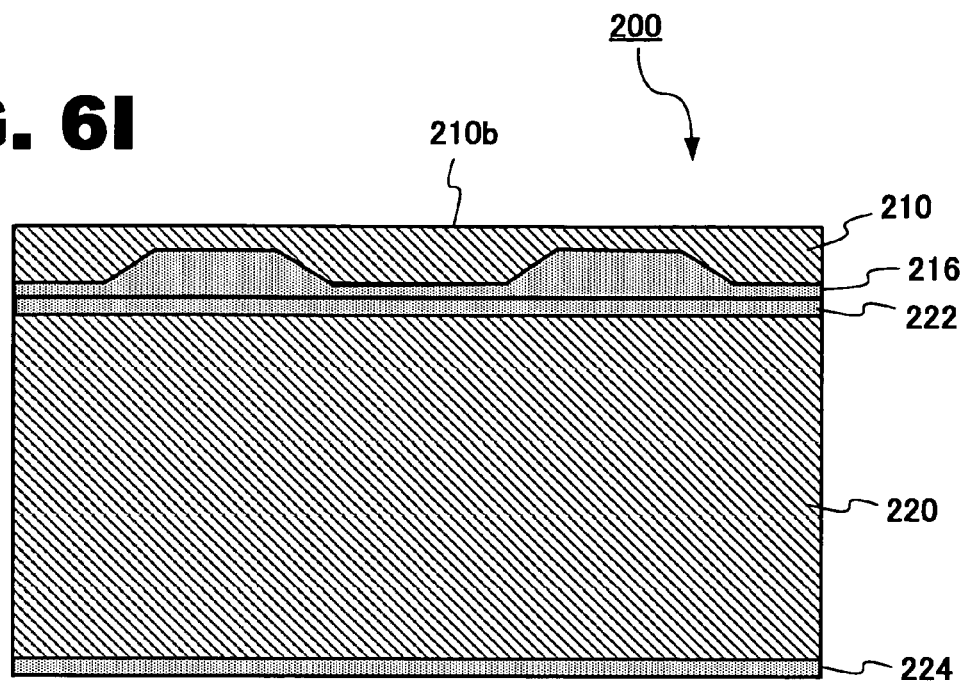
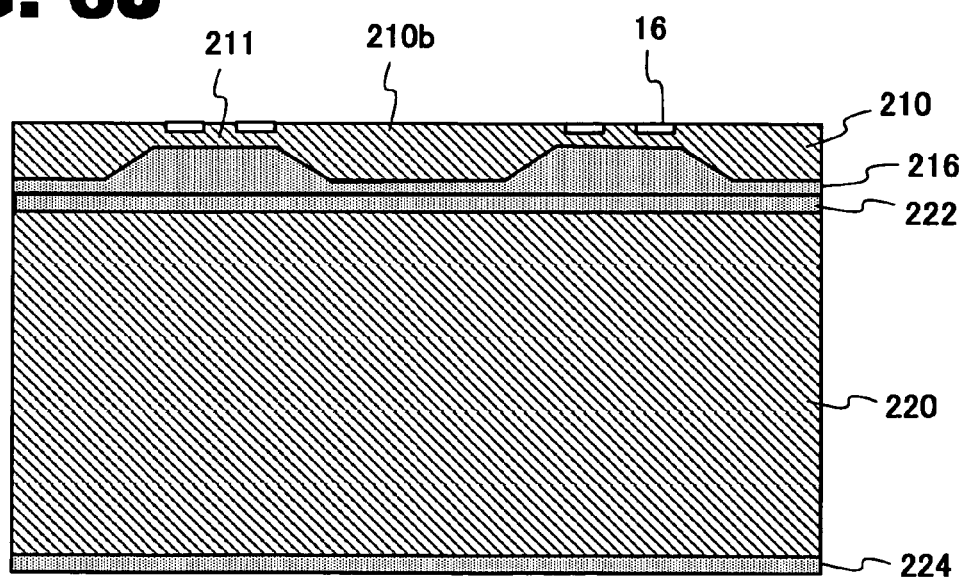

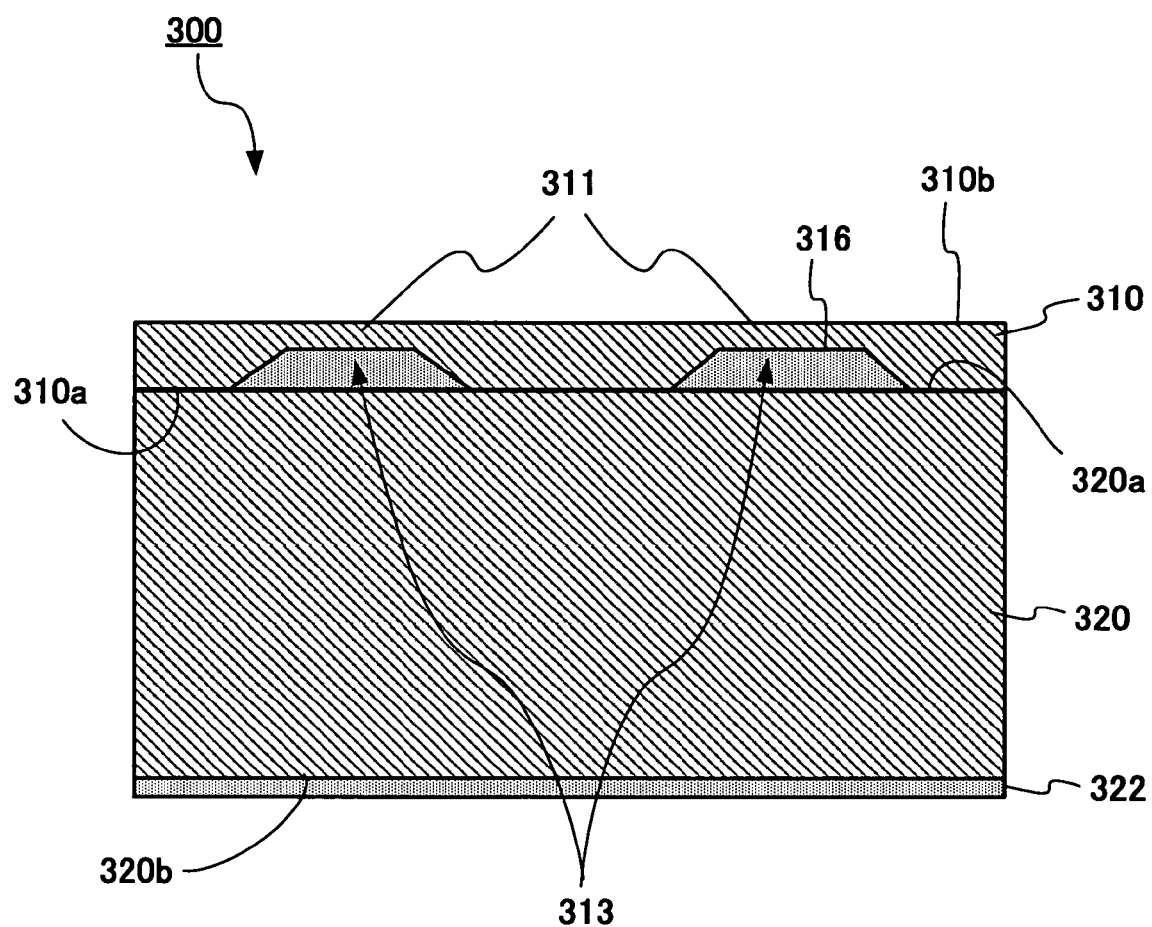

SOI SUBSTRATE AND SEMICONDUCTOR ACCELERATION SENSOR USING THE SAME

CROSS REFERENCE TO RELATED APPLICATION

This application claims the priority of Application No. 2007-212622, filed Aug. 17, 2007 in Japan, the subject matter of which is incorporated herein by reference.

TECHNICAL FIELD OF THE INVENTION

The present invention relates to a SOI substrate in which an insulating layer is arranged between two silicon substrates. Also the present invention relates to a semiconductor acceleration sensor fabricated using such a SOI substrate.

BACKGROUND OF THE INVENTION

In recent years, a micro structure, which is a small in sized of hundreds micron meters, has been an object of public attention in the semiconductor manufacturing field. Such a micro structure is fabricated using a micro-machine technology, which is an application of semiconductor fine processing technology. A micro structure has been considered to be applied to a high-frequency device, including sensors and optical switches for optical communication. In general, a microstructure based on a micro-machine technology is fabricated using a semiconductor process, so that such a device can be integrated on a semiconductor chip together with a LSI for signal processing. Such a device is called "MEMS (Micro Electrical Mechanical System)" in the USA and "MIST (Micro System Technology)" in Europe.

An acceleration sensor can be fabricated using MEMS (MIST) technology. An acceleration sensor has been widely used for an airbag system of vehicle; a subsurface environment observation system for seismic activity; a seismic system for IT products; and so on. Japan Patent Publication No. H07-225240A describes a piezo-type of acceleration sensor using MEMS technology.

[Patent Related Publication 1] JP H07-225240A

An SOI wafer may be used for fabricating a semiconductor acceleration sensor based on MEMS technology. In general, a SOI wafer includes a balance oxide layer (SiO2); a supporting silicon layer (Si) formed on the balance oxide layer; a BOX oxide layer (SiO2) formed on the supporting silicon layer; and an active layer (Si) formed on the BOX oxide layer. When fabricating such a SOI wafer, a wafer state of a supporting substrate is shaped to have a predetermined thickness, and a surface of the wafer is mirror-finished. After that, oxide layers are formed on the both surface of the wafer as a BOX layer and a balance layer. Next, thus fabricated supporting substrate of a wafer state is laminated with a silicon wafer for an active layer. Next, the active layer is polished to have a predetermined thickness by a CMP process.

However, according to a SOI wafer fabricated by the above-described conventional method, an active layer is formed to have a uniform thickness and it is difficult to adjust or control the thickness of the active layer. Since the active layer is adjusted in thickness by processing its surface, the surface may be uneven, and therefore, a resist layer is hardly coated on the uneven surface. As a result, it is difficult to form a fine (micro) resist pattern on the wafer, and it is difficult to miniaturize a semiconductor device fabricated using such a wafer.

In a semiconductor acceleration sensor, fabricated using a SOI wafer, a mass is formed from a supporting substrate (Si) and beams are formed from an active layer (Si). A stopper layer may be formed from the active layer to restrict over movement (excess movement) of the mass. According to the conventional acceleration sensor, a sensitivity of piezo resistance elements, formed on the beams, is low; and protecting performance of the stopper layer is not sufficient.

OBJECTS OF THE INVENTION

It is an object of the present invention is to provide a SOI substrate in which an active layer (Si) can be selectively controlled in thickness without negative affect to following processes.

Another object of the present invention is to provide a method for fabricating a SOI substrate in which an active layer (Si) can be selectively controlled in thickness without negative affect to following processes.

Further object of the present invention is to provide an acceleration sensor having a higher sensitivity and an improved protecting performance with a stopper layer.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a SOI substrate includes a first silicon substrate having first and second surfaces; a second silicon substrate having first and second surfaces; and a first insulating layer formed between first surface of the first silicon substrate and the first surface of the second silicon substrates. The first surface of the first silicon substrate is partly depressed to form a thin-layer region thereat. The first insulating layer is formed at least in the thin-layer region.

According to a second aspect of the present invention, a semiconductor acceleration sensor, in which acceleration is detected based on movement of a mass supported by beams, includes a first silicon substrate having first and second surfaces; a second silicon substrate having first and second surfaces; and a first insulating layer formed between first surface of the first silicon substrate and the first surface of the second silicon substrates. A mass is formed from the second silicon substrate. Beams are formed from the first silicon substrate. A stopper layer is formed from the first silicon substrate to restrict over movement of the mass. The beams have a thickness that is smaller (thinner) than that of the stopper layer.

According to a third aspect of the present invention, a method for fabricating a SOI substrate includes the steps of: providing a first silicon substrate having first and second surfaces; forming a depressed region on the first surface of the first silicon substrate to reduce the thickness thereat; forming a first insulating layer at least in the depressed region; flattening the first surface of the first silicon substrate with the first insulating layer; providing a second silicon substrate having first and second surfaces; and sticking the first surface of the first silicon substrate and the first surface of the second silicon substrate to each other.

Preferably, before sticking the first and second silicon substrate to each other, a second insulating layer may be formed on the first surface of the second silicon substrate, so that the first and second insulating layers are faced and stuck each other.

Preferably, the flattening process of the first surface of the first silicon substrate is performed so that the first insulating layer remains over the first surface entirely.

Preferably, the flattening process of the first surface of the first silicon substrate is performed so that the first insulating layer remains only in the depressed region of the first surface.

Preferably, the fabricating method further includes the step of forming a third insulating layer on the second surface of the second silicon substrate.

Preferably, the depressed region is shaped to have a tapered edge.

According to the first and second aspects of the present invention, the first silicon substrate is processed to form regions having different thicknesses selectively before the first and second silicon substrates are stuck to each other, so that it becomes easier to flatten a surface of a completed SOI substrate. As a result, negative affections for the following processes, caused by unevenness of the SOI substrate, can be prevented.

According to the third aspect of the present invention, in addition to the advantages of the first and second aspects of the present invention, a higher sensitivity and an improved protecting performance with a stopper layer can be obtained. Beams are formed to have a smaller thickness, so that the beams are deformed easily. On the other hand, a stopper layer is formed to have a larger thickness, so that the stopper can prevent over move of a mass sufficiently.

BRIEF DESCRIPTION OF THE DRAWINGS

FIGS. 6A to 6M are cross-sectional views showing fabrication steps of the semiconductor acceleration sensor according to the second preferred embodiment.

FIG. 7 is a cross-sectional view illustrating an SOI substrate used for fabricating a semiconductor acceleration sensor according to a third preferred embodiment of the present invention.

DESCRIPTION OF REFERENCE NUMERALS

15: Stopper
16: Piezo Resistive Element
14: Beam
23a, 23b: Mass
24: Depressed Region
110, 210 and 310: First Silicon Substrate
111, 211 and 311: Thin Layer Region
113, 213 and 133: Depressed Region
110a, 210a and 310a: First Surface
110b, 210b and 310b: Second Surface
120, 220 and 320: Second Silicon Substrate
120a, 220a and 320a: First Surface
120b, 220b and 320b: Second Surface
116, 216 and 316: First Insulating Layer

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
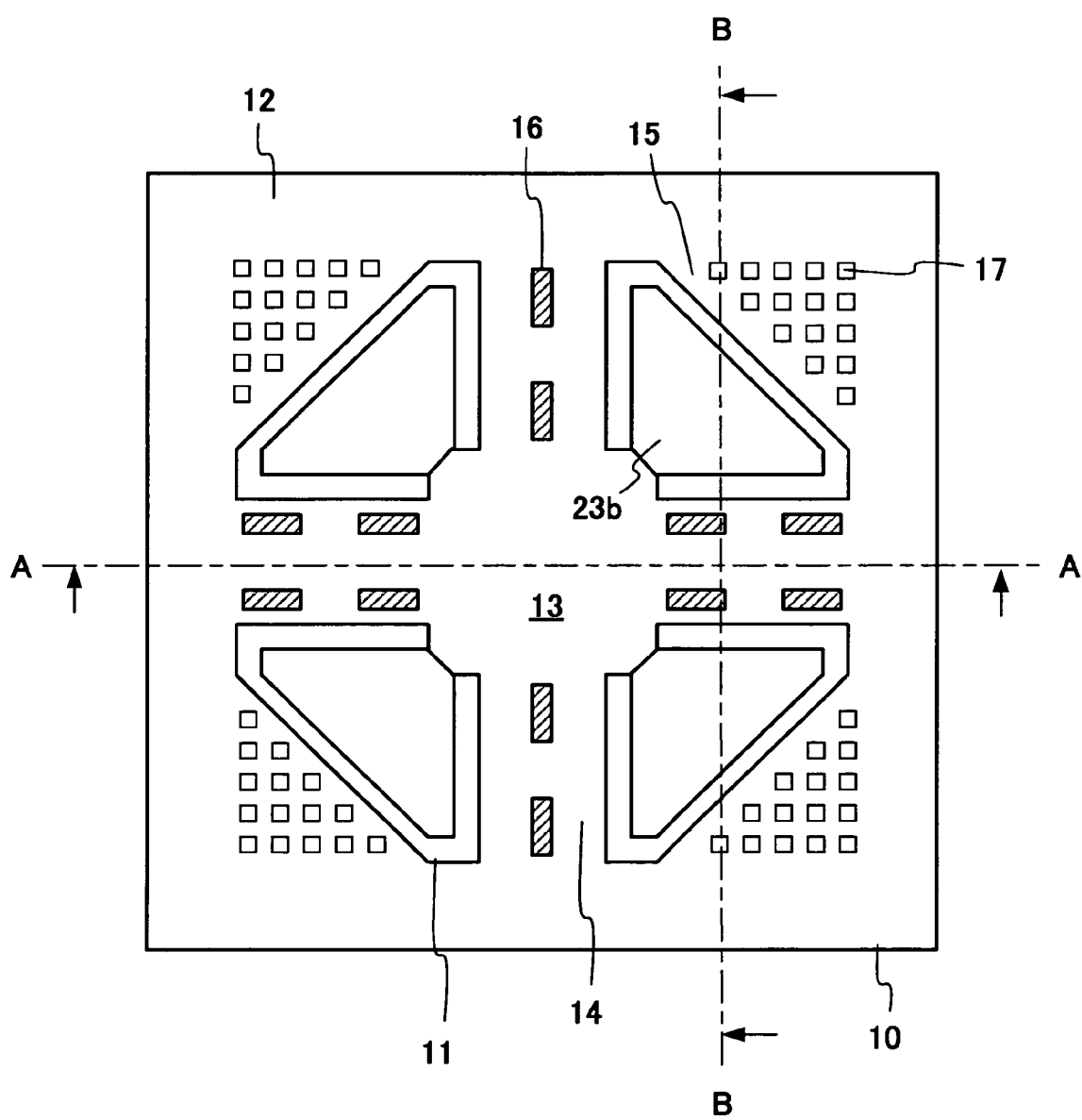
FIG. 1 is a plane view illustrating a semiconductor acceleration sensor, to which the present invention is applicable.
Figure 2A:
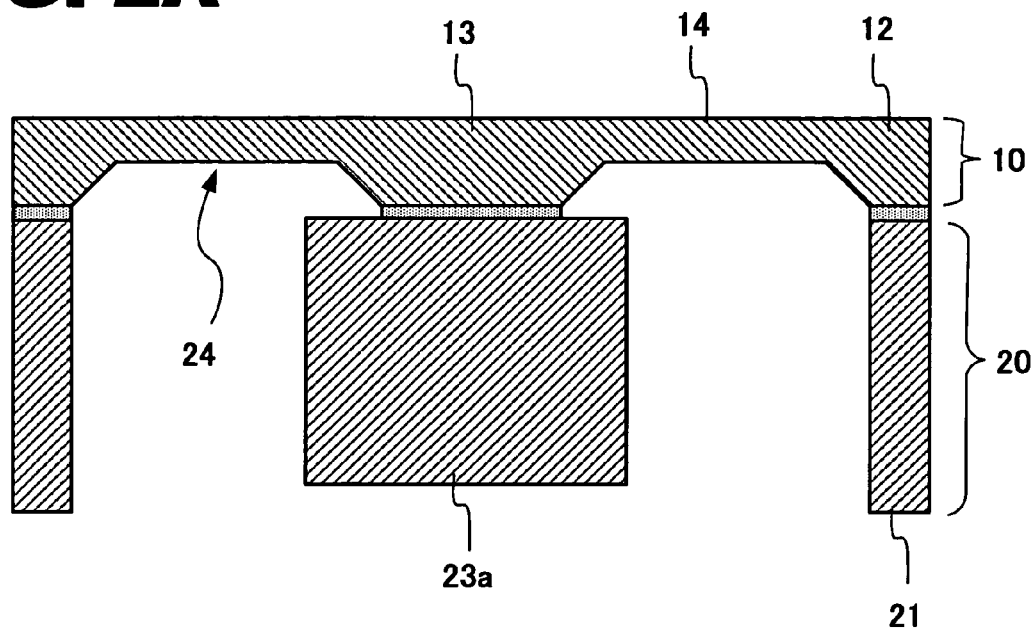
FIG. 2A is a cross-sectional view taken on line A-A in FIG. 1.
Figure 2B:
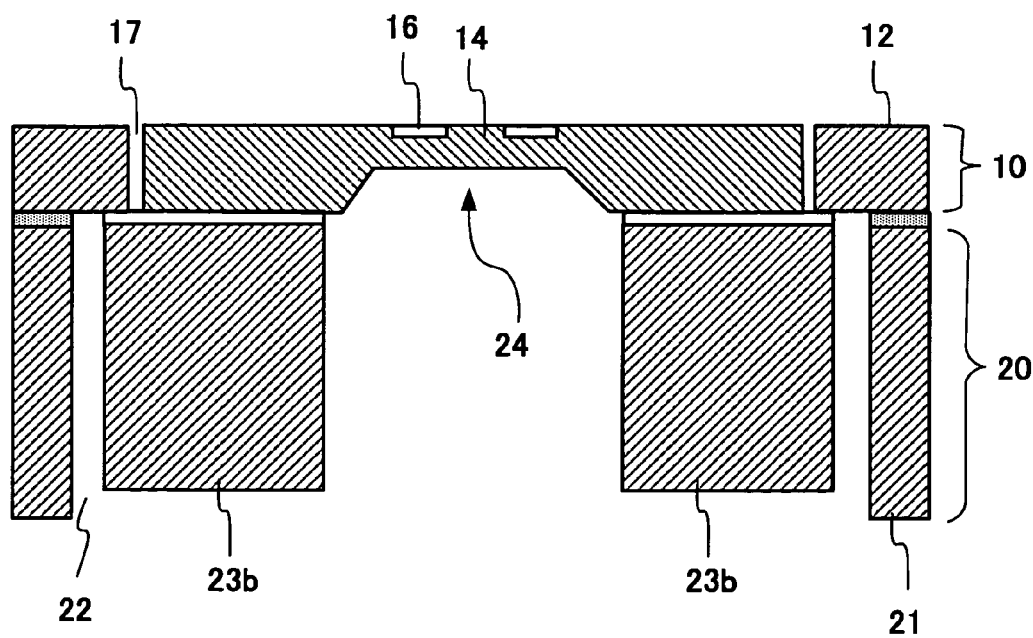
FIG. 2B is a cross-sectional view taken on line B-B in FIG. 1.

FIG. 1 is a plane view illustrating a semiconductor acceleration sensor, to which the present invention is applicable. FIG. 2A is a cross-sectional view taken on line A-A in FIG. 1. FIG. 2B is a cross-sectional view taken on line B-B in FIG. 1. An acceleration sensor is fabricated using a SOI (Silicon On Insulator) wafer. The SOI wafer includes a first silicon substrate 10 having a thickness of about 5 micro meters (μm), a second silicon substrate (13) having a thickness of about 525 micro meters (μm) and an insulating layer arranged between the first and second silicon substrates 10 and 13.

The first silicon substrate 10 for an acceleration sensor is shaped to be square with sides of 2.5 mm. The first silicon substrate 10 is provided with four of openings 11 to form peripheral supporting regions 12, a mass supporting region 13, beams 14 and stopper regions 15. The peripheral supporting regions 12 are formed at peripherals of the first silicon substrate 10 to have a width of about 500 micro meters (μm). The mass supporting region 13 is formed at a center of the first silicon substrate 10 and is shaped to be almost square with sides of about 700 micro meters (μm). The beams 14 are formed to have a width of about 400 micro meters (μm) to connect the mass supporting region 13 with the peripheral supporting regions 12. Four of piezo resistive elements 16 are formed on a surface of the beams 14, in which the electrical resistance of each piezo resistive elements is changed in response to mechanical deformation of the beams 14.

In a square region surrounded by a peripheral supporting region 12 and a couple of the beams 14, a right triangle region having two sides corresponding to two sides of the peripheral supporting region 12 is formed as a stopper region 15. In other words, each of the stopper regions 15 is formed at a corner of the first silicon substrate 10. The stopper region 15 is provided with a plurality of small openings 17.

On the other hand, the second silicon substrate 20 includes four frame (stand) regions 21 having a width of about 500 micro meters (μm); and a mass 23 formed inside the frame regions 21. The frame regions 21 are arranged to correspond to the peripheral supporting regions 12 of the first silicon substrate 10. A gap 22 is formed between the mass 23 and the frame regions 21. The mass 23 is shaped to have regions correspond to the mass supporting region 13, the opening 11 and the stopper regions 15. In other words, the mass 23 includes a center mass portion 23a corresponding to the mass supporting region 13; and four of peripheral mass portions 23b connected to the corners of the center mass portion 23a.

Regions on the second silicon substrate 20 correspond to the beams 14 of the first silicon substrate 10 are removed to form grooves 24. The thickness of the mass 23 is smaller than that of the frame regions 21 by a maximum permissible displacement magnitude, for example 5 micro meters (μm).

First Preferred Embodiment

Figure 3:
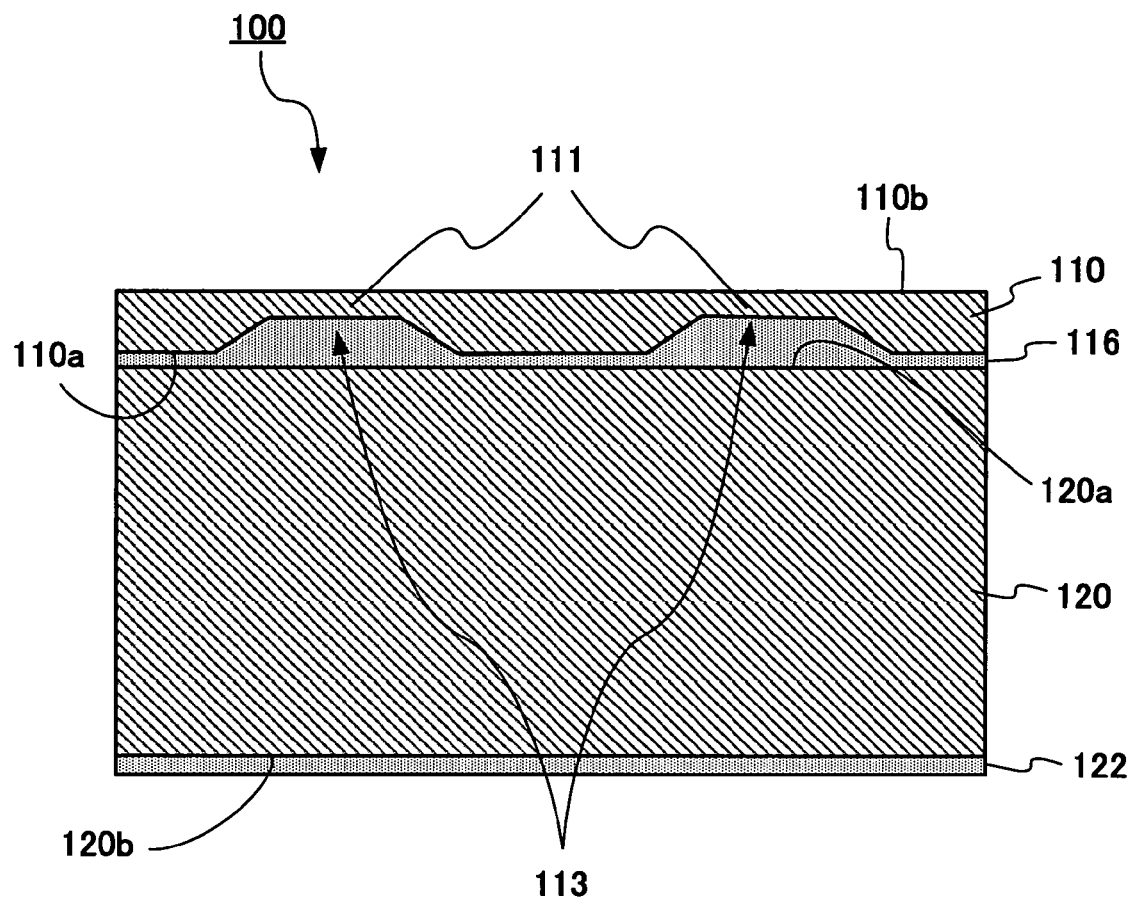
FIG. 3 is a cross-sectional view illustrating an SOI substrate used for fabricating a semiconductor acceleration sensor according to a first preferred embodiment of the present invention.

Next, a structure of a SOI substrate 100, which is applicable to an acceleration sensor shown in FIG. 1 according to a first preferred embodiment of the present invention, is described in reference to FIG. 3. The SOI substrate 100 includes a first silicon substrate 110, a second silicon substrate 120 and a first insulating layer 116. The first insulating layer 116 is provided between a first surface 110a of the first silicon substrate 100 and a first surface 120a of the second silicon substrate 120. The first surface 110a of the first silicon substrate 110 is selectively depressed to form thin-layer regions 111. The first insulating layer 116 is formed at least in or on the thin-layer regions 111.

According to the present embodiment, the first insulating layer 116 is formed on the first surface 110a of the first silicon substrate 100 entirely including the thin-layer regions 111.

The depressed regions 113 forming the thin-layer regions 111 are shaped to have tapered edges. As described later, since the depressed regions 113 have tapered edges, the thickness of the thin-layer regions 111 corresponding to beams is decreased inwardly gradually. As a result, stress is prevented from being concentrated at a specific area, and therefore, a shock resistance of the sensor is improved.

Figure 4A:
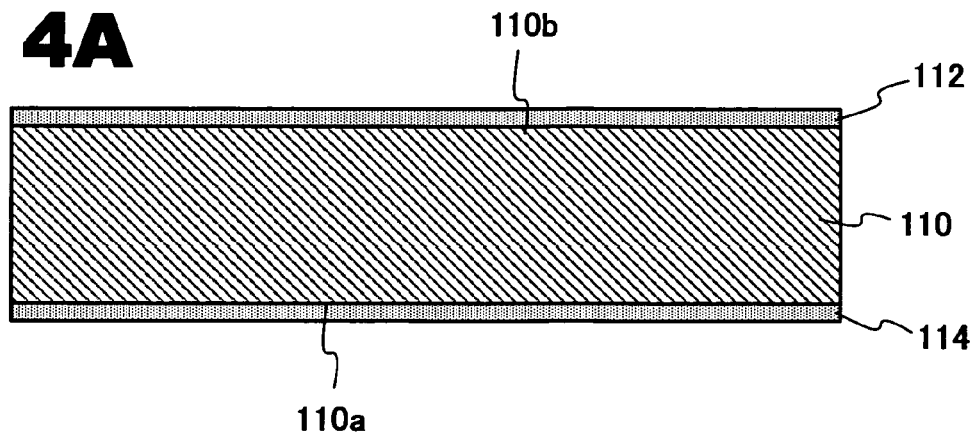
FIGS. 4A to 4M are cross-sectional views showing fabrication steps of the semiconductor acceleration sensor according to the first preferred embodiment.

Next, a method for fabricating the SOI substrate 100 according to the first preferred embodiment and a method for fabricating an acceleration sensor using the same will be described in reference to FIGS. 4A to 4M. First as shown in FIG. 4A, oxide layers 112 and 114 are formed on both upper and lower surfaces of the first silicon substrate 110. The first silicon substrate 110 may be a N-type silicon substrate having a thickness of about 6 to 7 micro meters (μm) and a volume resistivity of about 6 to 8 ohms(Ω)/cm.

Figure 4B:
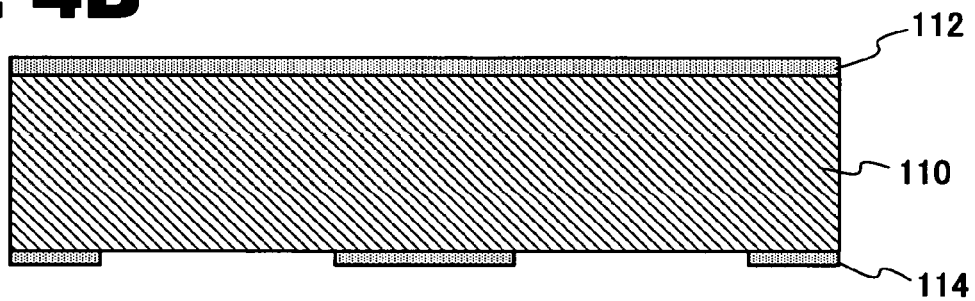
Figure 4C:
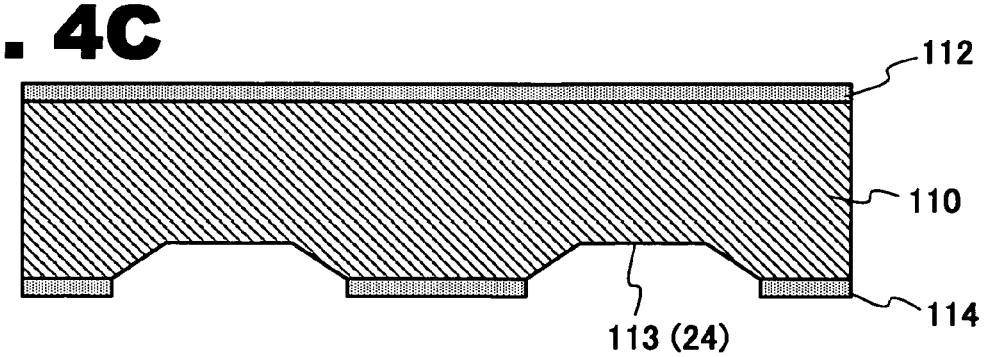

Next, as shown in FIG. 4B, the oxide layer 114 is patterned, and the silicon substrate 110 is partly exposed at a region corresponding to the thin-layer region 111 to be. Next, as shown in FIG. 4C, the first silicon substrate 110 is wet-etched using the oxide layer 114 as an etching mask to form a depressed portion 113. The depressed portion 113 may be shaped to have a depth of about 3 to 4 micro meters (μm).

In this process, the first silicon layer has an orientation (100), so that all line portions are processed to have profiles inclined by the same angle. Since the depressed portion 113 is shaped to have a tapered edge, the thickness of the beam regions 111 is decreased inwardly gradually. As a result, stress is prevented from being concentrated at a specific area, and therefore, a shock resistance of the sensor is improved. Further, since a wet-etching process is performed but not a dry-etching, the etched surface is flattened precisely at a higher flatness.

Figure 4D:
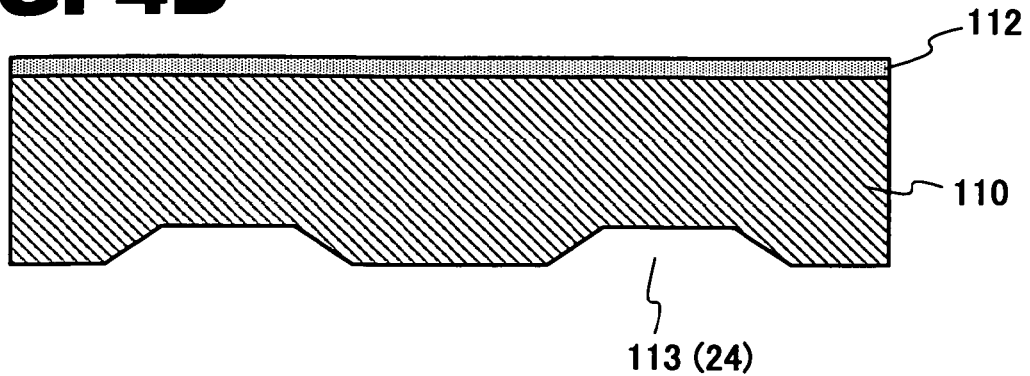
Figure 4E:
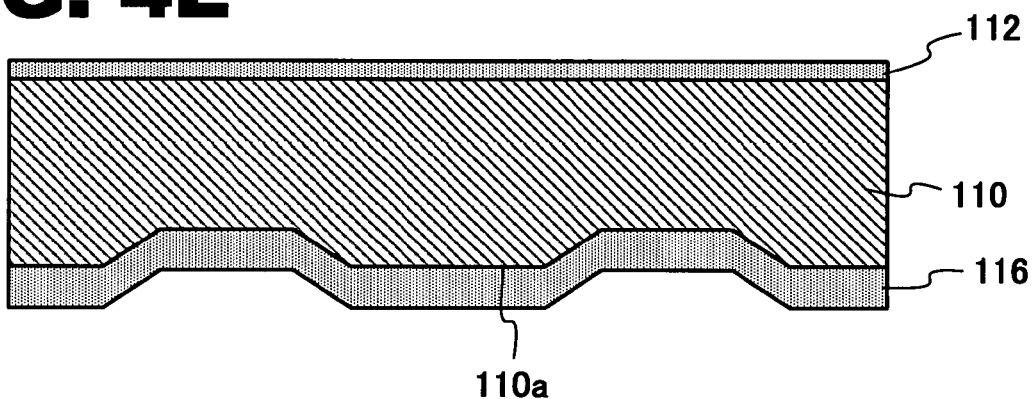

Next, as shown in FIG. 4D, the oxide layer 114 is removed. After that, as shown in FIG. 4E, another oxide layer 116 (BOX oxide layer: first insulating layer) is formed on the first surface 110a of the silicon substrate 110. The oxide layer 116 is formed to have a thickness that is larger than the depth of the depressed region 113. Next, as shown in FIG. 4F, the oxide layer 116 is polished to flatten its surface by a CMP process.

Figure 4F:
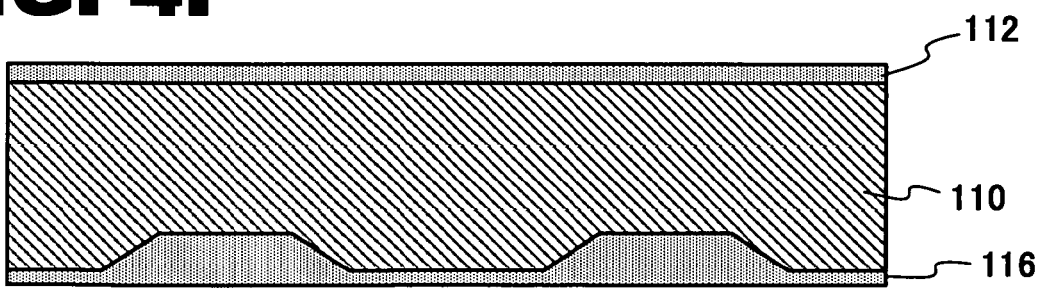
Figure 4G:
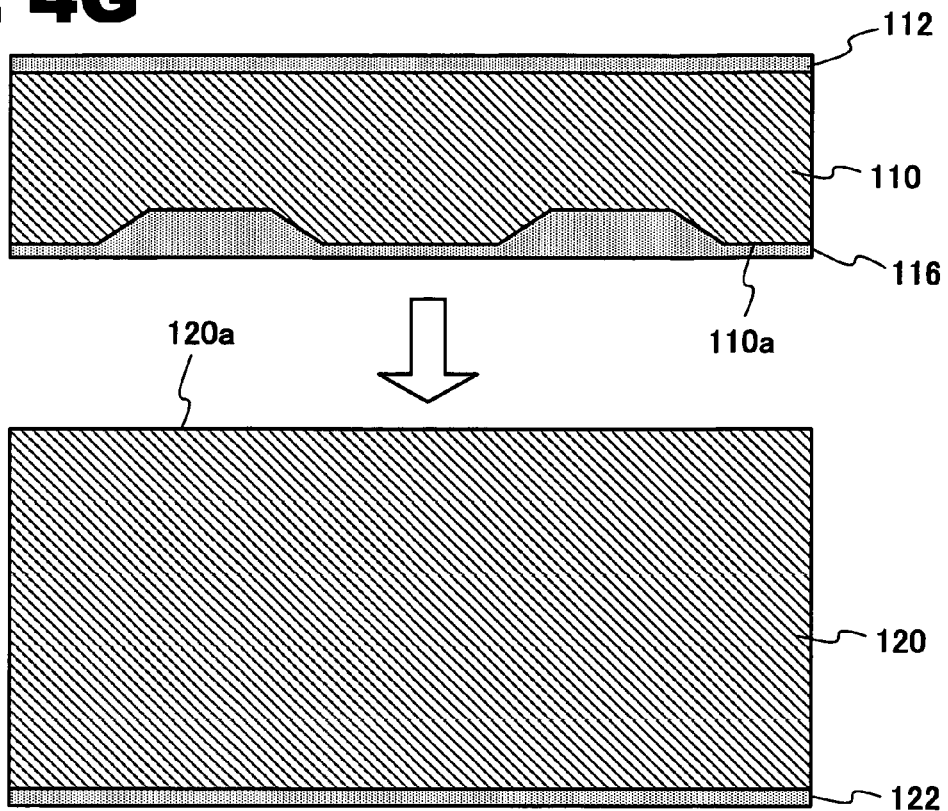

Next, as shown in FIG. 4G, the first silicon substrate 110 and the second silicon substrate 120, shown in FIG. 4F, are stuck or laminated or bonded to each other. At this time, the oxide layer (first insulating layer) 116 formed on the first surface 110a of the first silicon substrate and the first surface 120a of the second silicon substrate 120 are facing and in contact with each other.

Figure 4H:
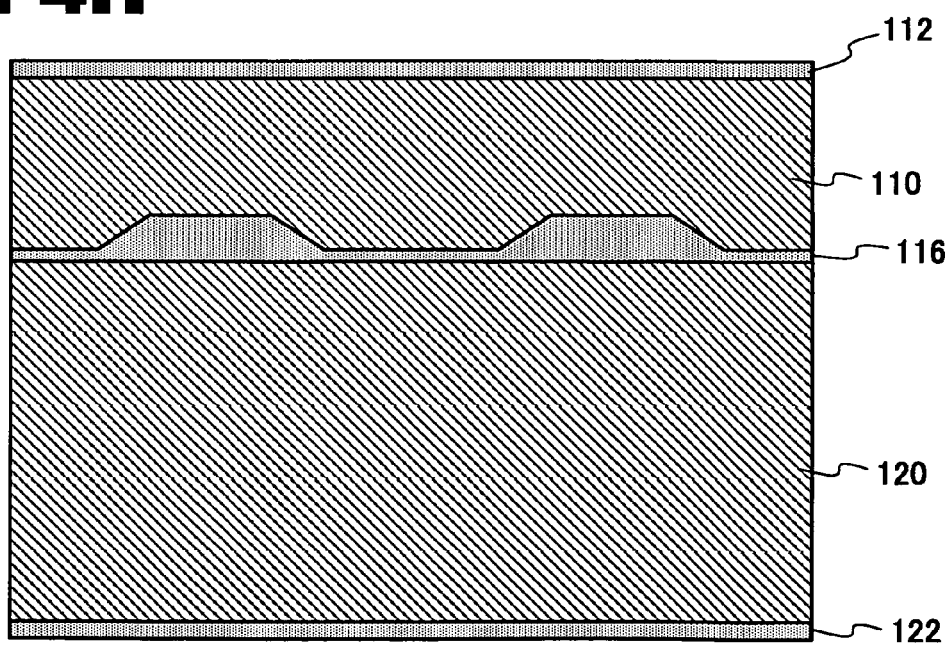

A balance oxide layer (SiO2: third insulating layer) 122 is formed on a second surface (bottom in FIG. 4F) of the second silicon substrate 120. FIG. 4H shows the first and second silicon substrates 110 and 120 fixed to each other. The second silicon substrate 120 may have a thickness of about 350 micro meters (μm) and a volume resistivity of about 16 ohms(Ω)/cm. The oxide layer (third insulating layer 122 has a thickness of about 2 to 3 micro meters (μm).

Figure 4I:
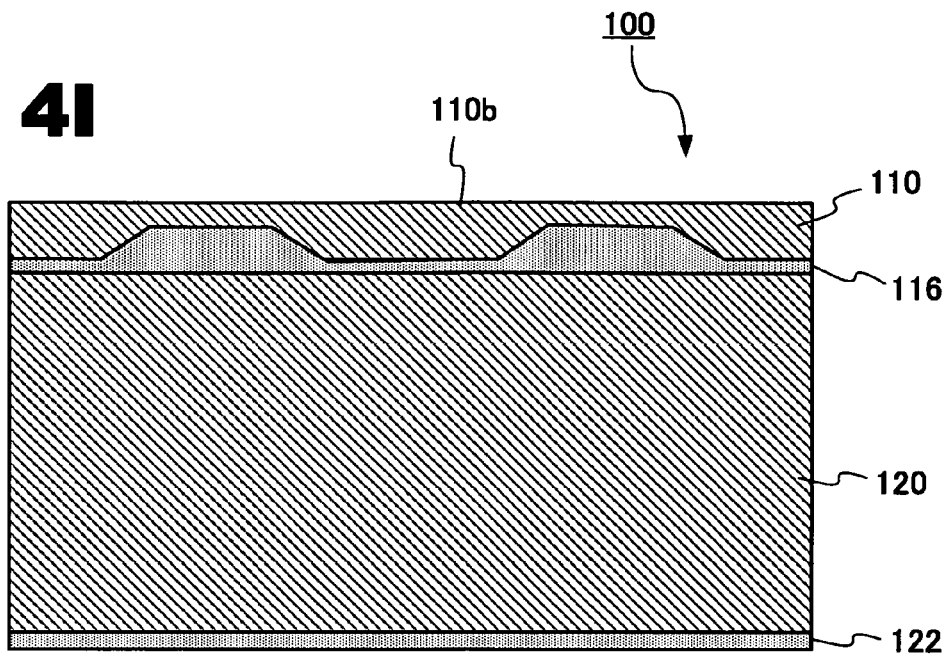

Next, as shown in FIG. 4I, the second surface 110b of the first silicon substrate 110 is polished by a CMP process to shape the first silicon substrate 110 to have a predetermined thickness and to complete the SOI substrate according to the first preferred embodiment.

Figure 4J:
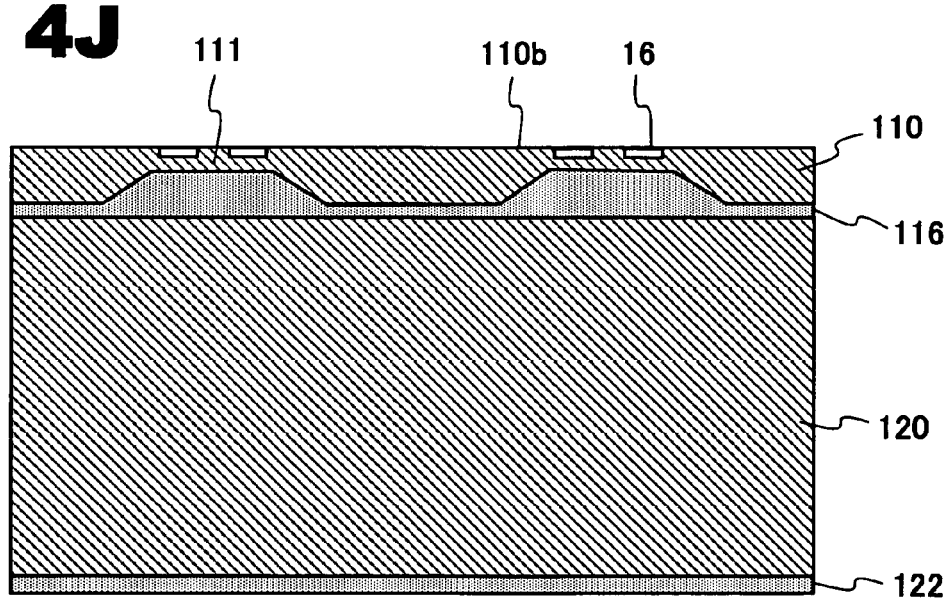

After that, the SOI substrate 100 is used for fabricating an acceleration sensor. First, as shown in FIG. 4J, piezo resistive elements 16 are formed on the thin-layer regions 111, formed on the second surface 110b of the first silicon substrate 110.

Figure 4K:
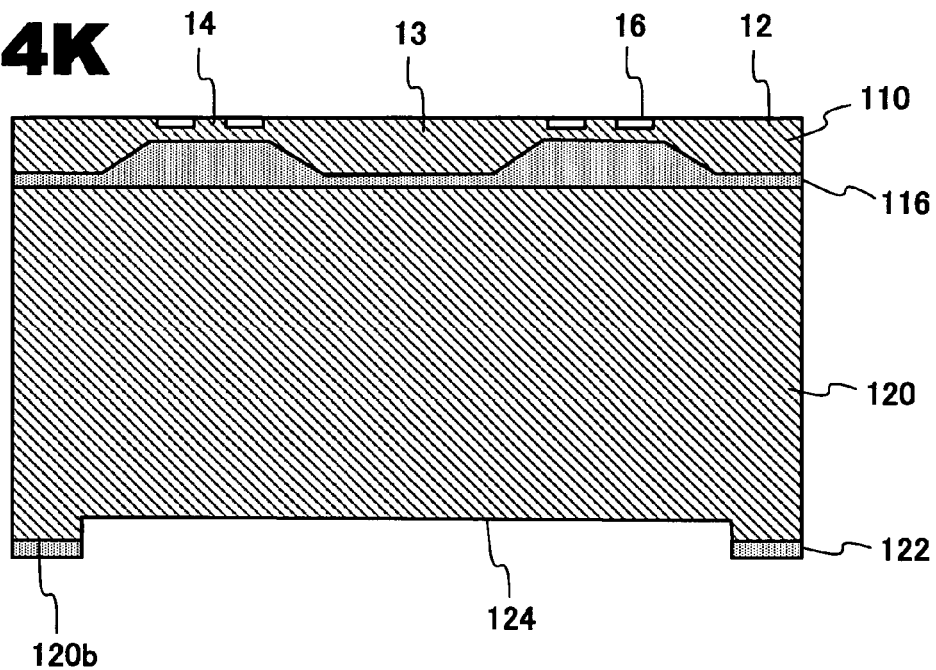
Figure 4L:
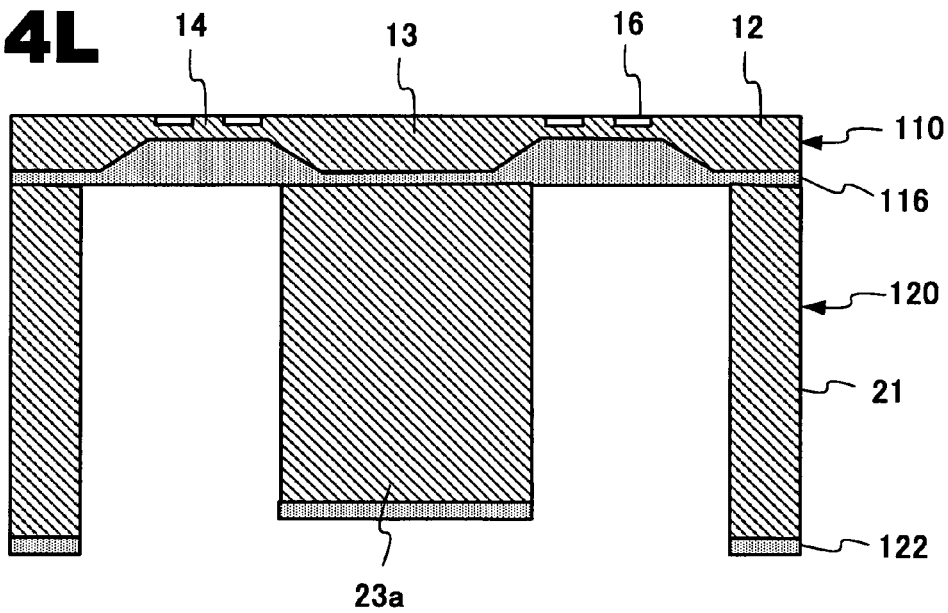

Next, as shown in FIG. 4K, the second surface 120b of the second silicon substrate 120 is reduced in thickness to form a depressed region 124. Outside of the depressed region 124 will be the frame 21. Next, as shown in FIG. 4L, mass portions 23a and 23b (not shown) are formed from the second silicon substrate 120 by photolithography process and etching process. Openings are formed on the second silicon substrate 120 to separate the beams 14 and the stopper regions 15 by photolithography process and etching process. At the same time, other openings (17) are formed. The openings (17) will be used to remove the insulating layer 116 located between the peripheral mass regions (23b) and the stopper regions (15). The openings 17 are shown in FIGS. 1 and 2.

Figure 4M:
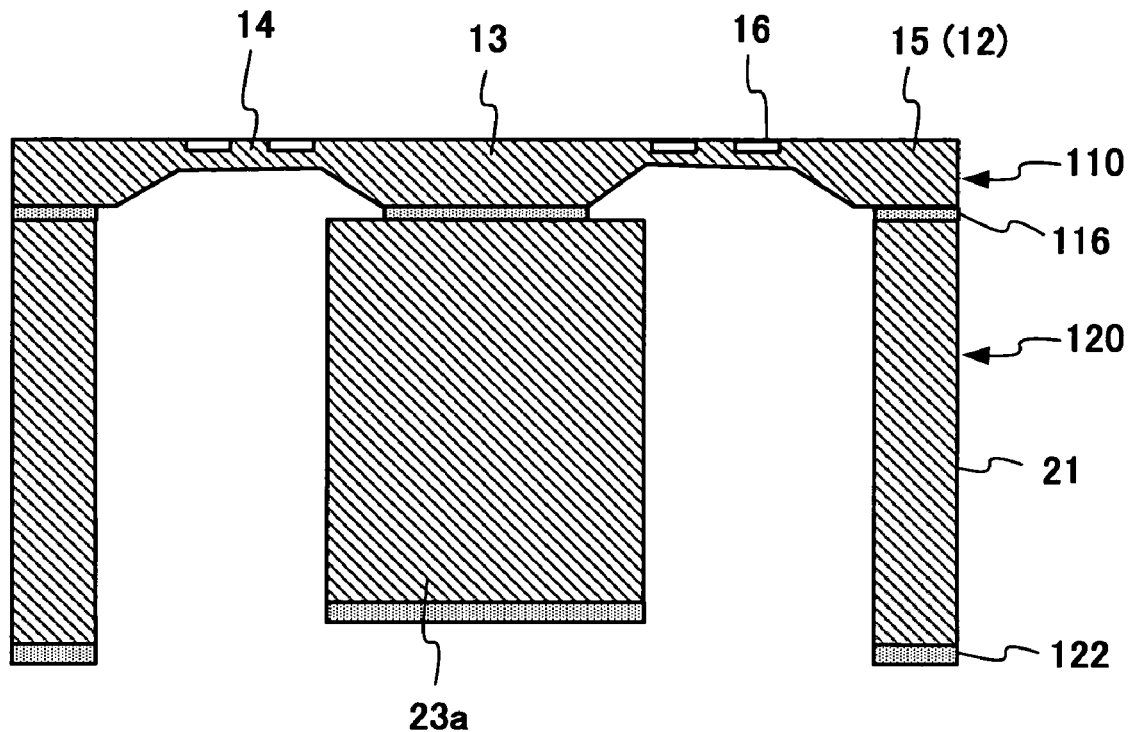

Next, the SOI substrate is dipped in hydrofluoric acid to remove the insulating layer (oxide layer) 116 so that the insulating layer 116 only remains on the frames 21 and the mass 23a, as shown in FIG. 4M. In this process, buffer hydrofluoric acid flows through the openings 11 and 17, formed on the first silicon substrate 110 and through grooves on the second silicon substrate 120, so that the insulating layer 116 located between the peripheral mass regions 23b and the stopper regions 15 is removed. After that, the SOI substrate (wafer) is diced to form individual semiconductor chips, and well known processes including packaging and wiring are carried out.

Next, operation of the acceleration sensor is described briefly. When a downward acceleration is applied to the mass 23 of the acceleration sensor, the beams 14 are deformed and the mass 23 moves down. The mass 23 is prevented from over moving (excess movement) in a downward direction by the container. In other words, if the mass 23 moves downwardly too much, the mass 23 is in contact with the bottom of the container and no longer moves downwardly. When an upward acceleration is applied to the mass 23 of the acceleration sensor, the beams 14 are deformed and the mass 23 moves upwardly. The mass 23 is prevented from over moving (excess movement) in an upward direction by the stopper regions 15. In other words, if the mass 23 moves upwardly too much, the mass 23 is in contact with the stoppers 15 and no longer moves upwardly.

The resistance value of each of the resistive elements 16 formed on the four beams 14 is changed in response to deformation of the corresponding beam 14. Based on the amount of change of the resistance values, amount and direction of acceleration applied to the sensor is calculated.

According to the above described first preferred embodiment, the depressed regions 113 are formed on the first silicon substrate 110 before the first and second silicon substrates 110 and 120 are put together. As a result, a surface of a completed SOI substrate 100 fabricated from those two substrates 110 and 120 is easily flattened.

Further, the beams 14 are shaped to have a smaller thickness, so that the beams 14 are easily deformed and sensitivity of acceleration is improved. On the other hand, the stopper layer 15 is formed to have a larger thickness, the stoppers 15 sufficiently strict over movement of the mass 23. That is, according to the first preferred embodiment, both improvement of sensitivity and improvement of protecting performance with the stoppers can be obtained at the same time.

The SOI substrate 100 according to the present embodiment, a surface of the active layer (110b) is flat, so that fine processing of resist patterning can be carried out. As a result, amount of resist can be reduced, so that manufacturing cost can be reduced as well. In addition, an acceleration sensor can be fabricated small in size.

Second Preferred Embodiment

Figure 5:
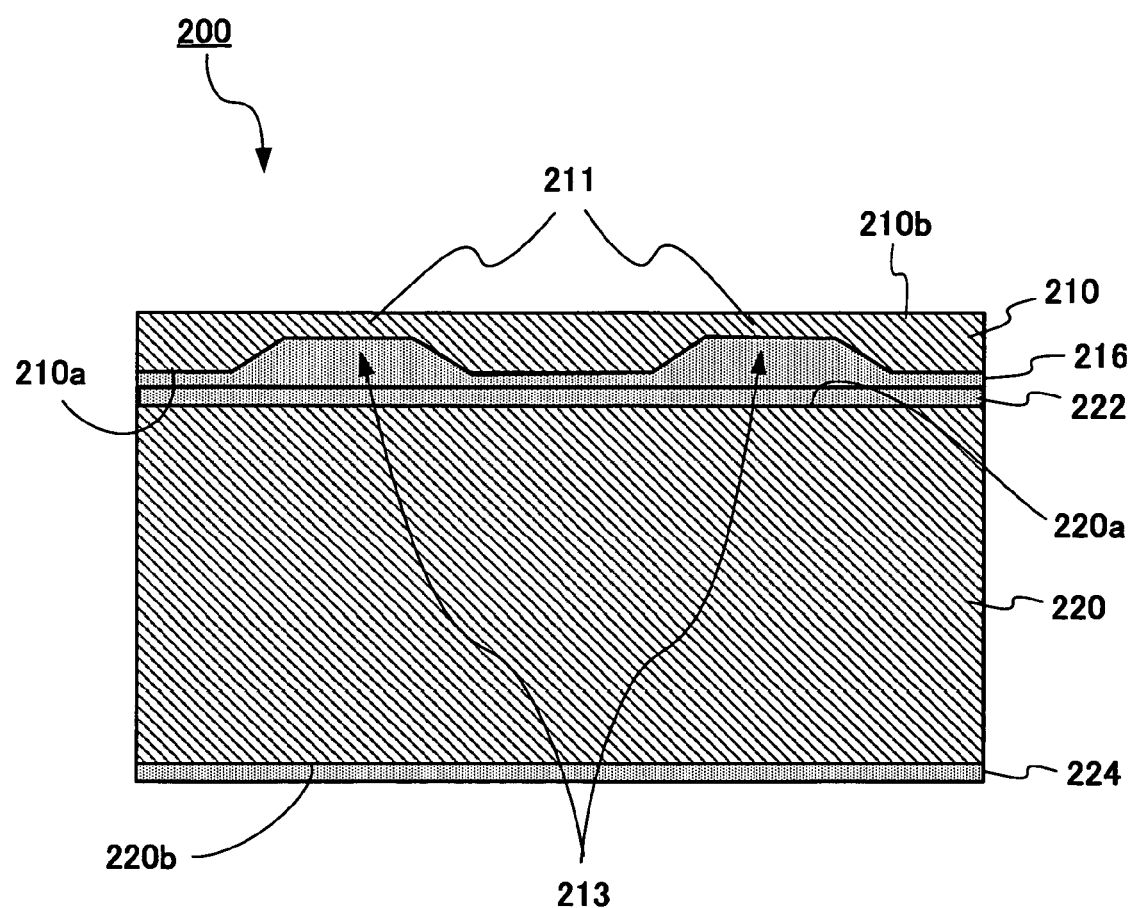
FIG. 5 is a cross-sectional view illustrating an SOI substrate used for fabricating a semiconductor acceleration sensor according to a second preferred embodiment of the present invention.

Next, a structure of a SOI substrate 200, which is applicable to an acceleration sensor shown in FIG. 1 according to a first preferred embodiment of the present invention, is described in reference to FIG. 5. The SOI substrate 200 includes a first silicon substrate 210, a second silicon substrate 220 and a first insulating layer 216. The first insulating layer 216 is provided between a first surface 210a of the first silicon substrate 200 and a first surface 220a of the second silicon substrate 220. The first surface 210a of the first silicon substrate 210 is selectively depressed to form thin-layer regions 211. The first insulating layer 216 is formed on the first surface 210a of the first silicon substrate 200 entirely including inside of the thin-layer regions (depressed regions) 211.

A third insulating layer 224 is formed on a second surface 220b of the second silicon substrate 220. Also, a fourth insulating layer 222 is formed on the first surface 220a of the second silicon substrate 220. The depressed regions 213 forming the thin-layer regions 211 are shaped to have tapered edges. As described later, since the depressed regions 213 have tapered edges, the thickness of the thin-layer regions 211 corresponding to beams is decreased inwardly gradually. As a result, stress is prevented from being concentrated at a specific area, and therefore, a shock resistance of the sensor is improved.

Figure 6A:
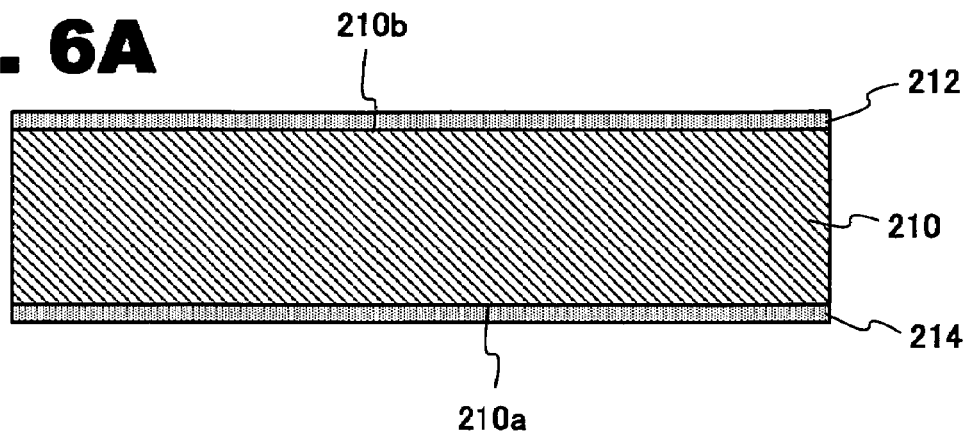

Next, a method for fabricating the SOI substrate 200 according to the second preferred embodiment and a method for fabricating an acceleration sensor using the same will be described in reference to FIGS. 6A to 6M. First as shown in FIG. 6A, oxide layers 212 and 214 are formed on both upper and lower surfaces of the first silicon substrate 210. The first silicon substrate 210 may be a N-type silicon substrate having a thickness of about 6 to 7 micro meters (μm) and a volume resistivity of about 6 to 8 ohms(Ω)/cm.

Figure 6B:
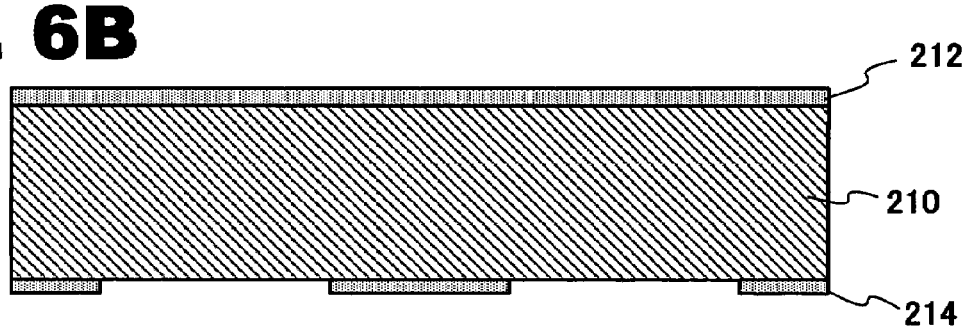
Figure 6C:
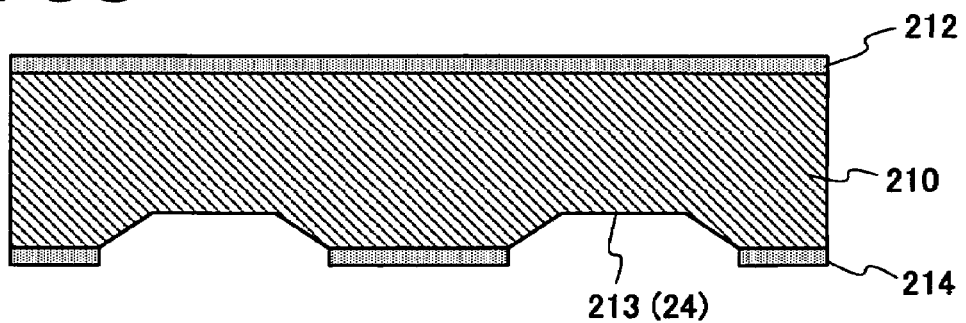

Next, as shown in FIG. 6B, the oxide layer 214 is patterned, and the silicon substrate 210 is partly exposed at a region corresponding to the thin-layer region 211 to be. Next, as shown in FIG. 6C, the first silicon substrate 210 is wet-etched using the oxide layer 214 as an etching mask to form a depressed portion 213. The depressed portion 213 may be shaped to have a depth of about 3 to 4 micro meters (μm).

In this process, the first silicon substrate 210 has an orientation (100), so that all line portions are processed to have profiles inclined by the same angle. Since the depressed portion 213 is shaped to have a tapered edge, the thickness of the beam regions 211 is decreased inwardly gradually. As a result, stress is prevented from being concentrated at a specific area, and therefore, a shock resistance of the sensor is improved. Further, since a wet-etching process is performed but not a dry-etching, the etched surface is flattened precisely at a higher flatness.

Figure 6D:
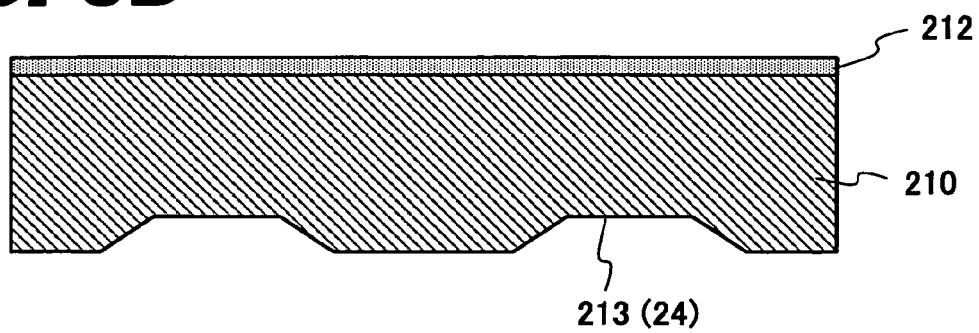
Figure 6E:
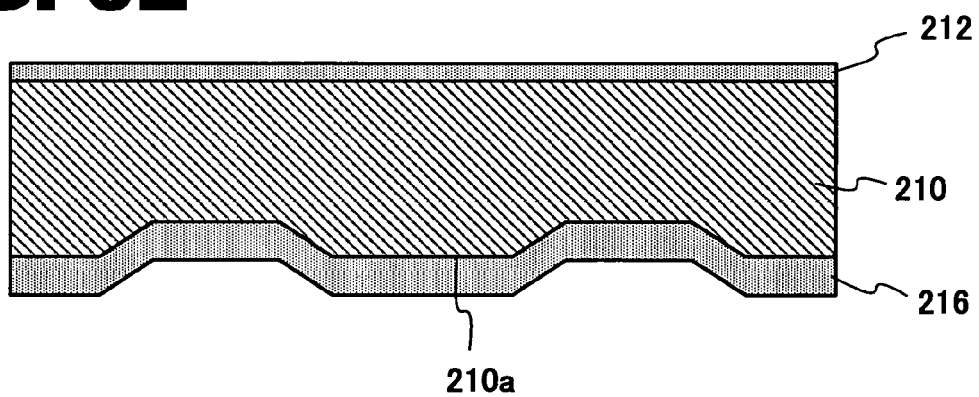

Next, as shown in FIG. 6D, the oxide layer 214 is removed. After that, as shown in FIG. 6E, another oxide layer 216 (BOX oxide layer: first insulating layer) is formed on the first surface 110a of the silicon substrate 210. The oxide layer 216 is formed to have a thickness that is larger than the depth of the depressed region 213. Next, as shown in FIG. 6F, the oxide layer 216 is polished to flatten its surface by a CMP process.

Figure 6F:
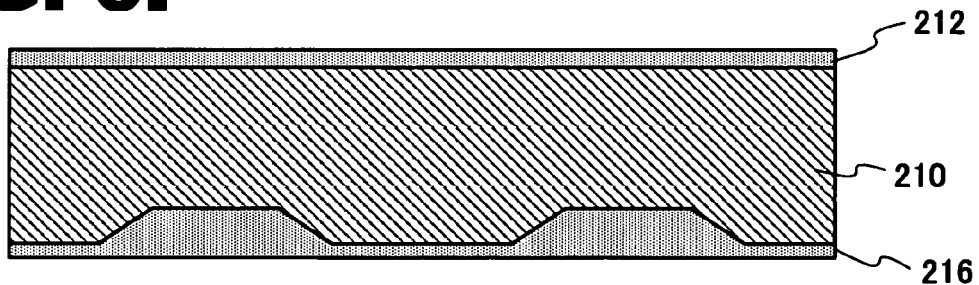
Figure 6G:
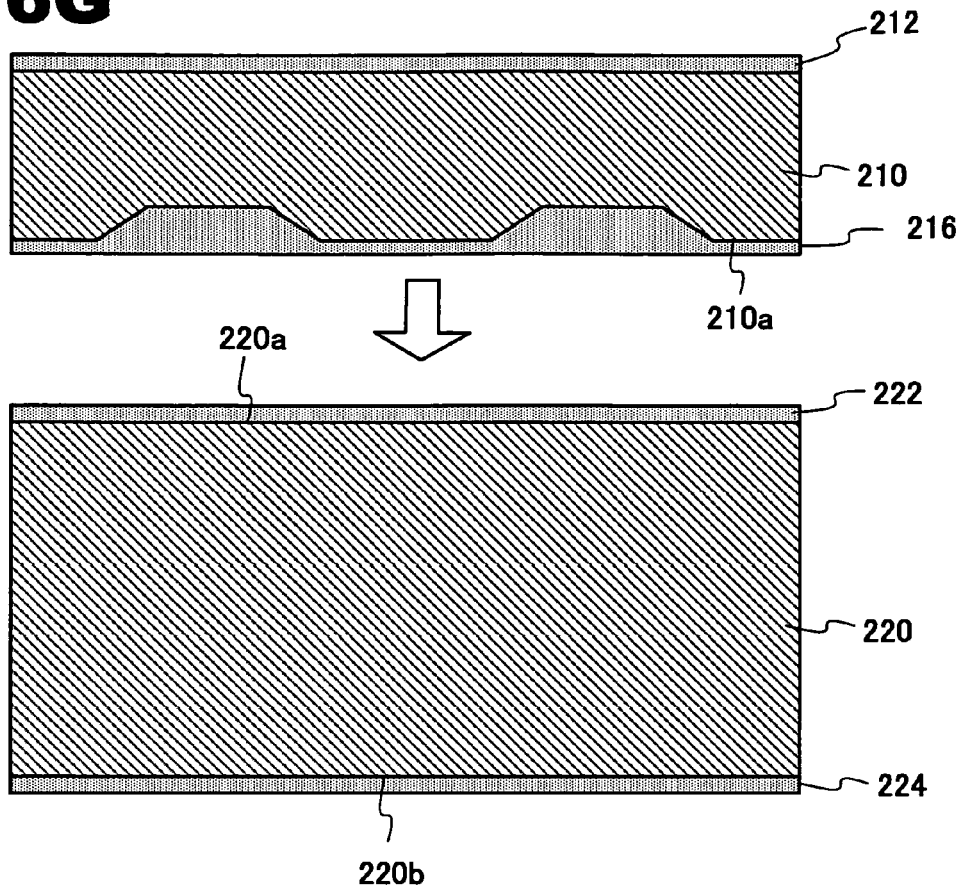

Next, as shown in FIG. 6G, the first silicon substrate 210 and the second silicon substrate 220, shown in FIG. 6F, are stuck or laminated or bonded to each other. At this time, the oxide layer (first insulating layer) 216 formed on the first surface 210a of the first silicon substrate 210 and the first surface 220a of the second silicon substrate 220 are facing and in contact with each other.

Figure 6H:
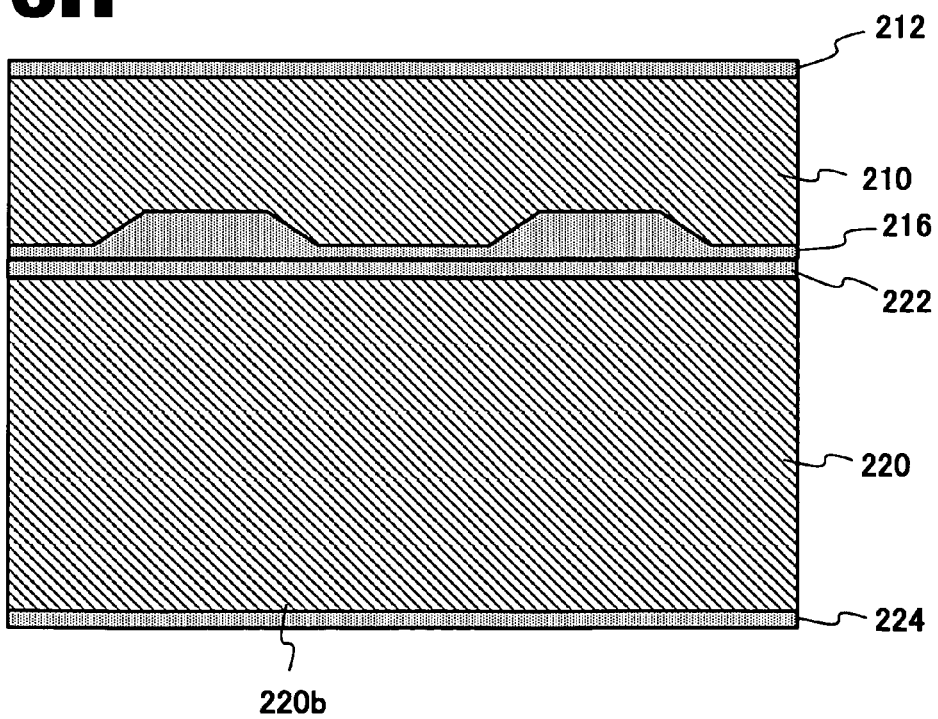

A balance oxide layer (SiO2: third insulating layer) 224 is formed on a second surface 220b of the second silicon substrate 220. FIG. 6H shows the first and second silicon substrates 210 and 220 fixed to each other. The second silicon substrate 220 may have a thickness of about 350 micro meters (μm) and a volume resistivity of about 16 ohms(Ω)/cm. The oxide layer (third insulating layer 224 has a thickness of about 2 to 3 micro meters (μm).

Next, as shown in FIG. 6I, the second surface 210b of the first silicon substrate 210 is polished by a CMP process to shape the first silicon substrate 210 to have a predetermined thickness and to complete the SOI substrate according to the second preferred embodiment.

After that, the SOI substrate 200 is used for fabricating an acceleration sensor. First, as shown in FIG. 6J, piezo resistive elements 16 are formed on the thin-layer regions 211, formed on the second surface 210b of the first silicon substrate 210.

Figure 6K:
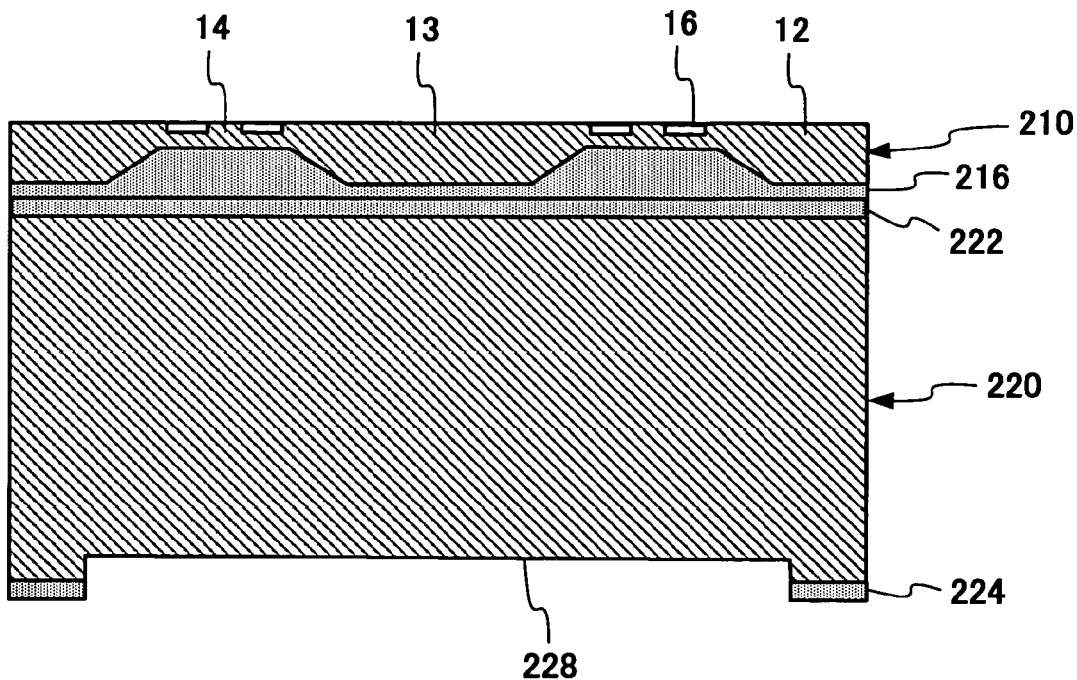
Figure 6L:
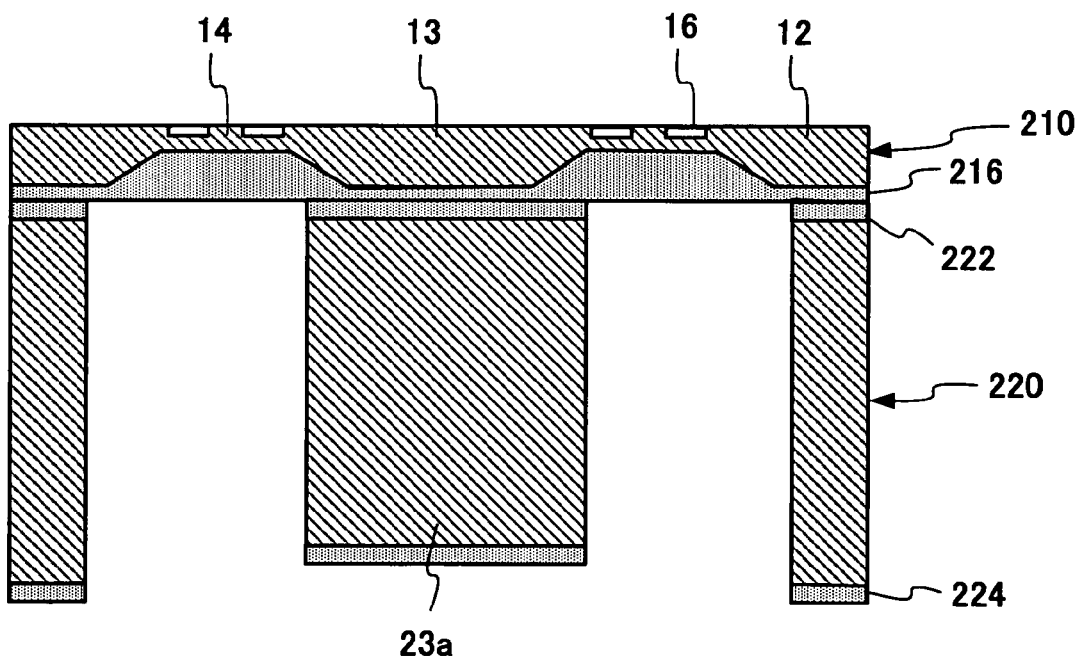

Next, as shown in FIG. 6K, the second surface 220b of the second silicon substrate 220 is reduced in thickness to form a depressed region 228. Outside of the depressed region 228 will be the frame 21. Next, as shown in FIG. 6L, mass portions 23a and 23b (not shown) are formed from the second silicon substrate 220 by photolithography process and etching process. Openings are formed on the second silicon substrate 220 to separate the beams 14 and the stopper regions 15 by photolithography process and etching process. At the same time, other openings (17) are formed. The openings (17) will be used when removing the insulating layer 216 located between the peripheral mass regions (23b) and the stopper regions (15). The openings 17 are shown in FIGS. 1 and 2.

Figure 6M:
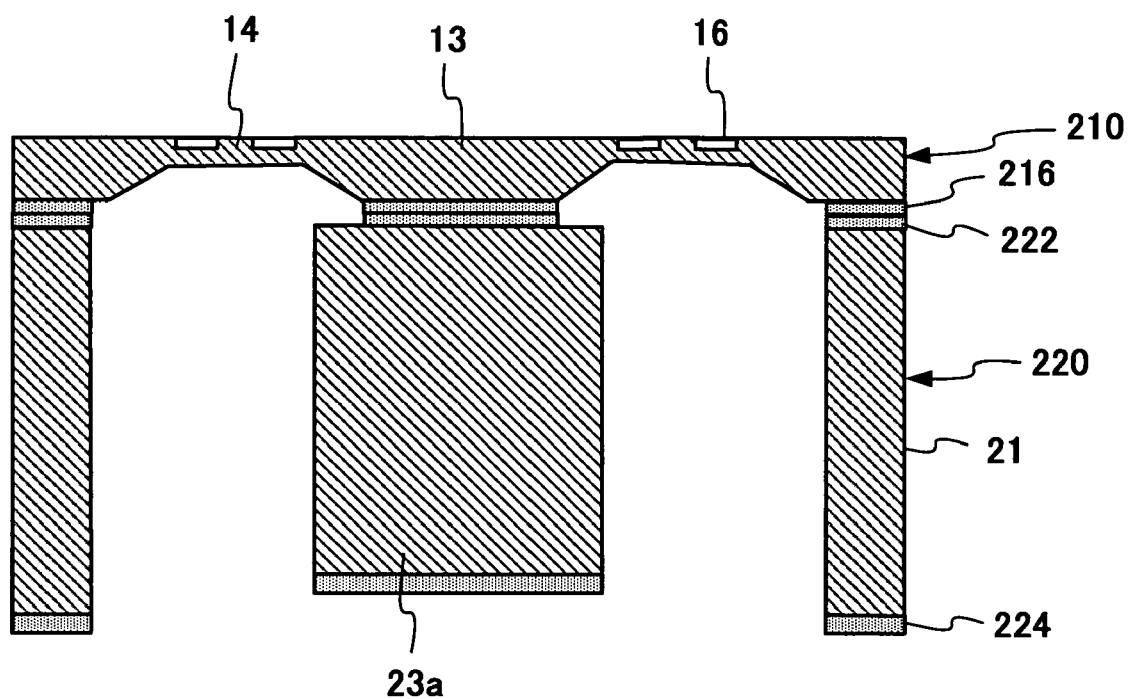

Next, the SOI substrate is dipped in hydrofluoric acid to remove the insulating layer (oxide layer) 216 so that the insulating layer 216 remains only on the frames 21 and the mass 23a, as shown in FIG. 6M. In this process, buffer hydrofluoric acid flows through the openings 11 and 17, formed on the first silicon substrate 210 and through grooves on the second silicon substrate 220, so that the insulating layer 216 located between the peripheral mass regions 23b and the stopper regions 15 is removed. After that, the SOI substrate (wafer) is diced to form individual semiconductor chips, and well known processes including packaging and wiring are carried out.

The operation of the acceleration sensor according to the present embodiment is the same as the first preferred embodiment, and is not repeated.

According to the above described second preferred embodiment, as well as the first preferred embodiment, the depressed regions 213 are formed on the first silicon substrate 210 before the first and second silicon substrates 210 and 220 are put (stuck) together. As a result, a surface of a completed SOI substrate 200 fabricated from those two substrates 210 and 220 is easily flattened.

Further, the beams 14 are shaped to have a smaller thickness, so that the beams 14 are easily deformed and sensitivity of acceleration is improved. On the other hand, the stopper layer 15 is formed to have a larger thickness, the stoppers 15 sufficiently strict over movement of the mass 23. That is, according to the first preferred embodiment, both improvement of sensitivity and improvement of protecting performance with the stoppers can be obtained at the same time.

The SOI substrate 200 according to the present embodiment, a surface of the active layer (210b) is flat, so that fine processing of resist patterning can be carried out. As a result, amount of resist can be reduced, so that manufacturing cost can be reduced as well. In addition, an acceleration sensor can be fabricated small in size.

In addition to the advantages of the first preferred embodiment, according to the present embodiment, the oxide layers 222 and 224 formed on the second silicon substrate 220 have the same thickness; and therefore, the second silicon substrate 220 can be prevented from being deformed before stuck with the first silicon substrate 210.

Third Preferred Embodiment

Next, a structure of a SOI substrate 300, which is applicable to an acceleration sensor shown in FIG. 1, according to a third preferred embodiment of the present invention is described in reference to FIG. 7. The SOI substrate 300 includes a first silicon substrate 310, and a second silicon substrate 320. A first surface 310a of the first silicon substrate 310 and a first surface 320a of the second silicon substrate 320 are directly in contact with and stuck or adhered with each other. The first surface 310a of the first silicon substrate 310 is selectively depressed to form thin-layer regions 311. The first insulating layer 316 is formed only in or on the thin-layer regions 311, so that the first insulating layer 316 is in contact with the second silicon substrate 320 only in areas corresponding to the thin-layer regions 311.

A third insulating layer 322 is formed on a second surface 320b of the second silicon substrate 320. No insulating layer is formed on the first surface 320a of the second silicon substrate 320. The depressed regions 313 forming the thin-layer regions 311 are shaped to have tapered edges. As described later, since the depressed regions 313 have tapered edges, the thickness of the thin-layer regions 311 corresponding to beams is decreased inwardly gradually. As a result, stress is prevented from being concentrated at a specific area, and therefore, a shock resistance of the sensor is improved.

Figure 8A:
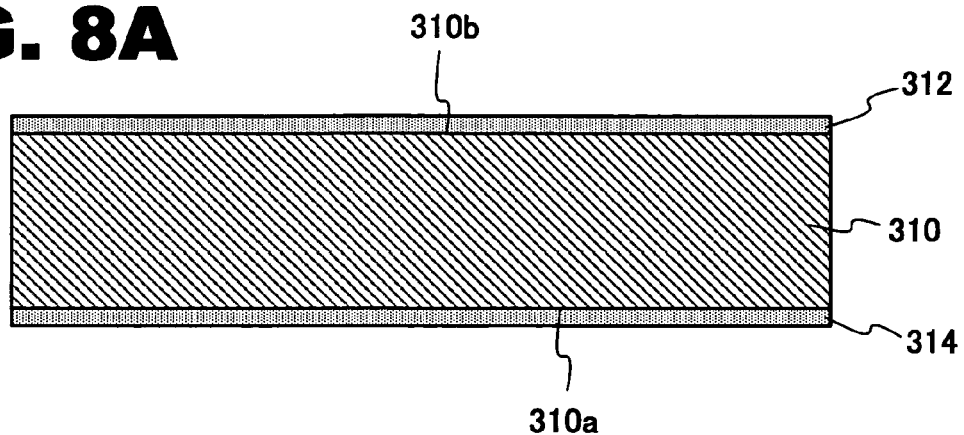
FIGS. 8A to 8M are cross-sectional views showing fabrication steps of the semiconductor acceleration sensor according to the third preferred embodiment.

Next, a method for fabricating the SOI substrate 100 according to the third preferred embodiment and a method for fabricating an acceleration sensor using the same will be described in reference to FIGS. 8A to 8M. First as shown in FIG. 8A, oxide layers 312 and 314 are formed on both upper and lower surfaces of the first silicon substrate 310. The first silicon substrate may be a N-type silicon substrate having a thickness of about 6 to 7 micro meters (μm) and a volume resistivity of about 6 to 8 ohms(Ω)/cm.

Figure 8B:
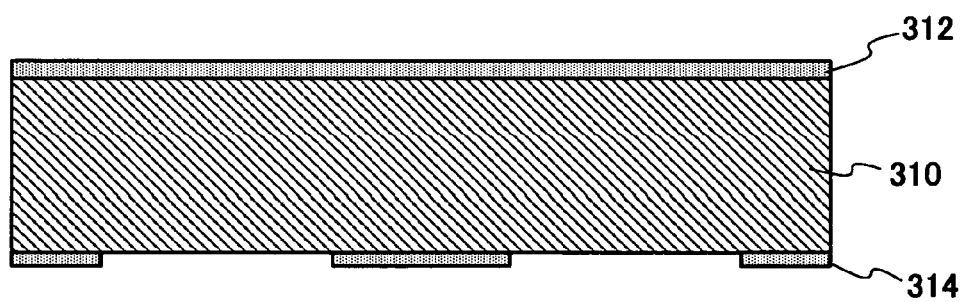
Figure 8C:
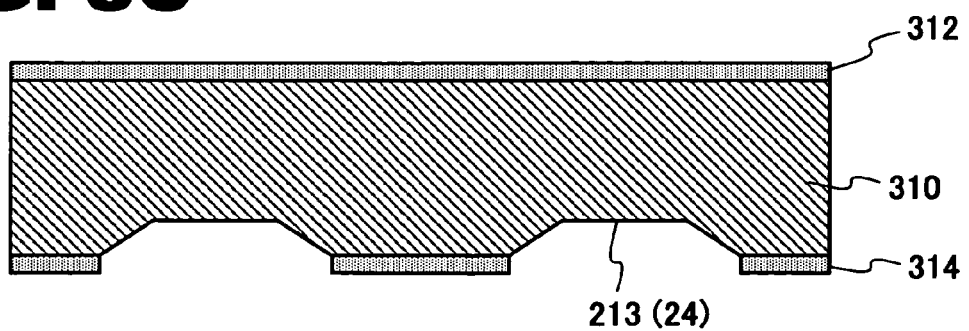

Next, as shown in FIG. 8B, the oxide layer 314 is patterned, and the silicon substrate 310 is partly exposed at a region corresponding to the thin-layer region 311 to be. Next, as shown in FIG. 8C, the first silicon substrate 310 is wet-etched using the oxide layer 314 as an etching mask to form a depressed portion 313. The depressed portion 313 may be shaped to have a depth of about 3 to 4 micro meters (μm). In this process, the first silicon layer has an orientation (100), so that all line portions are processed to have profiles inclined by the same angle. Since the depressed portion 313 is shaped to have a tapered edge, the thickness of the beam regions 311 is decreased inwardly gradually. As a result, stress is prevented from being concentrated at a specific area, and therefore, a shock resistance of the sensor is improved. Further, since a wet-etching process is performed but not a dry-etching, the etched surface is flattened precisely at a higher flatness.

Figure 8D:
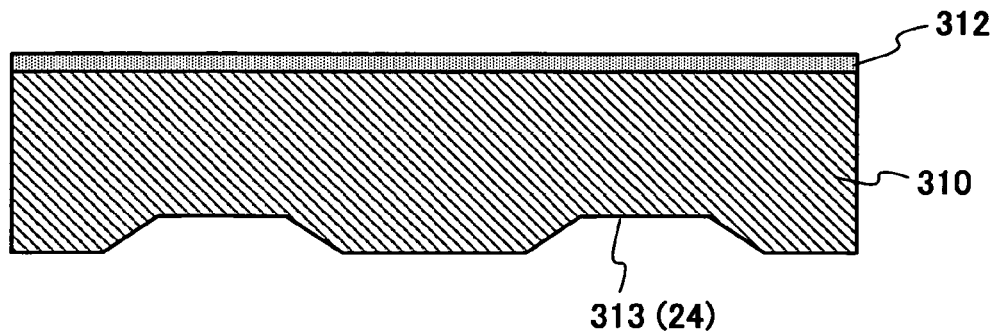
Figure 8E:
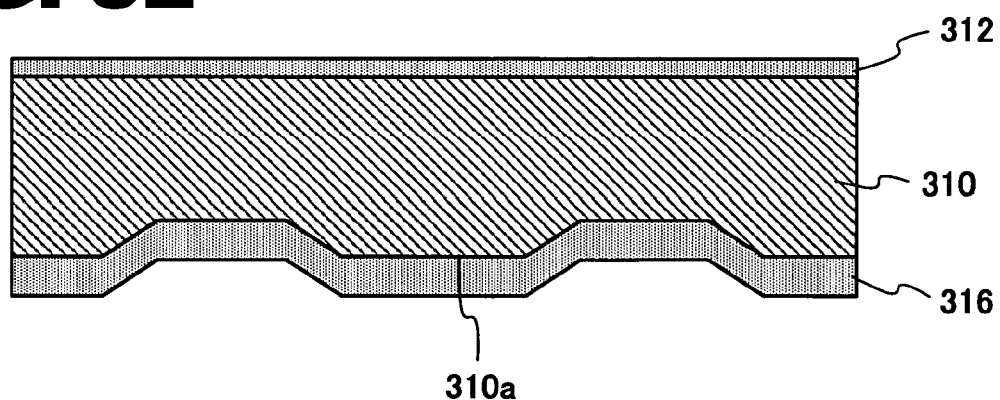

Next, as shown in FIG. 8D, the oxide layer 314 is removed. After that, as shown in FIG. 8E, another oxide layer 316 (BOX oxide layer: first insulating layer) is formed on the first surface 310a of the silicon substrate 310. The oxide layer 316 is formed to have a thickness that is larger than the depth of the depressed region 313. Next, as shown in FIG. 8F, the oxide layer 316 is polished to flatten its surface by a CMP process so that the first silicon surface 310a of the first silicon substrate 310 is exposed except areas corresponding to the depressed regions 313, and the oxide layer 316 remains only in the depressed regions 313.

Figure 8F:
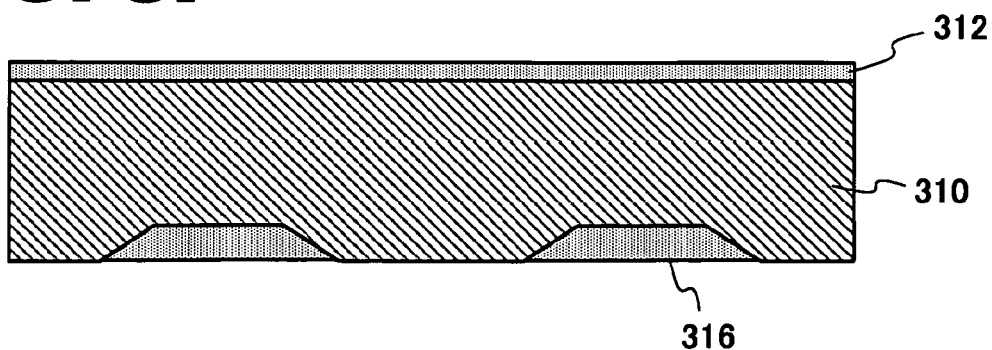
Figure 8G:
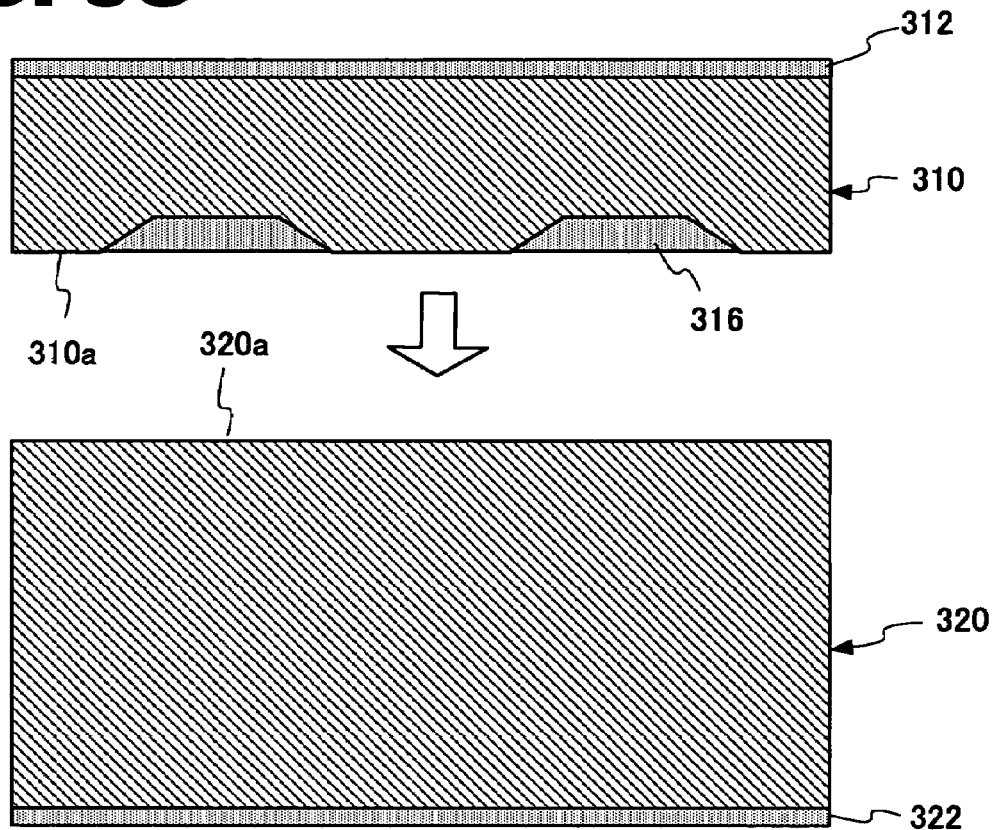

Next, as shown in FIG. 8G, the first silicon substrate 310 and the second silicon substrate 320, shown in FIG. 8F, are stuck or laminated or bonded to each other. At this time, the oxide layer (first insulating layer) 316 formed on the first surface 310a of the first silicon substrate and the first surface 320a of the second silicon substrate 320 are facing and in contact with each other.

Figure 8H:
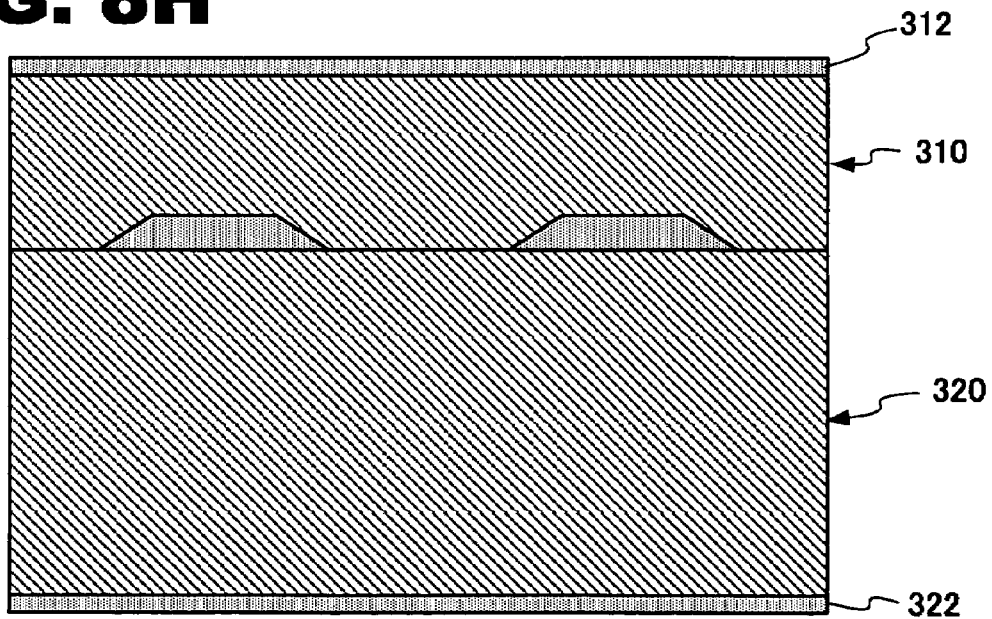

A balance oxide layer (SiO2: third insulating layer) 322 is formed on a second surface (bottom in FIG. 8F) of the second silicon substrate 320. FIG. 8H shows the first and second silicon substrates 310 and 320 fixed to each other. The second silicon substrate 320 may have a thickness of about 350 micro meters (μm) and a volume resistivity of about 16 ohms(Ω)/cm. The oxide layer (third insulating layer 322 has a thickness of about 2 to 3 micro meters (μm).

Figure 8I:
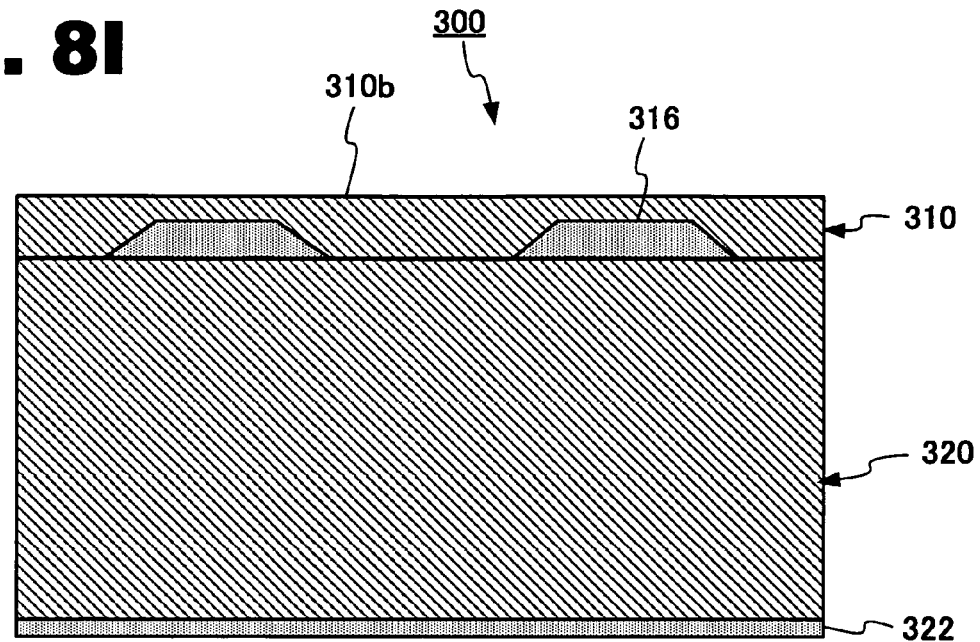

Next, as shown in FIG. 8I, the second surface 310b of the first silicon substrate 310 is polished by a CMP process to shape the first silicon substrate 310 to have a predetermined thickness and to complete the SOI substrate according to the third preferred embodiment.

Figure 8J:
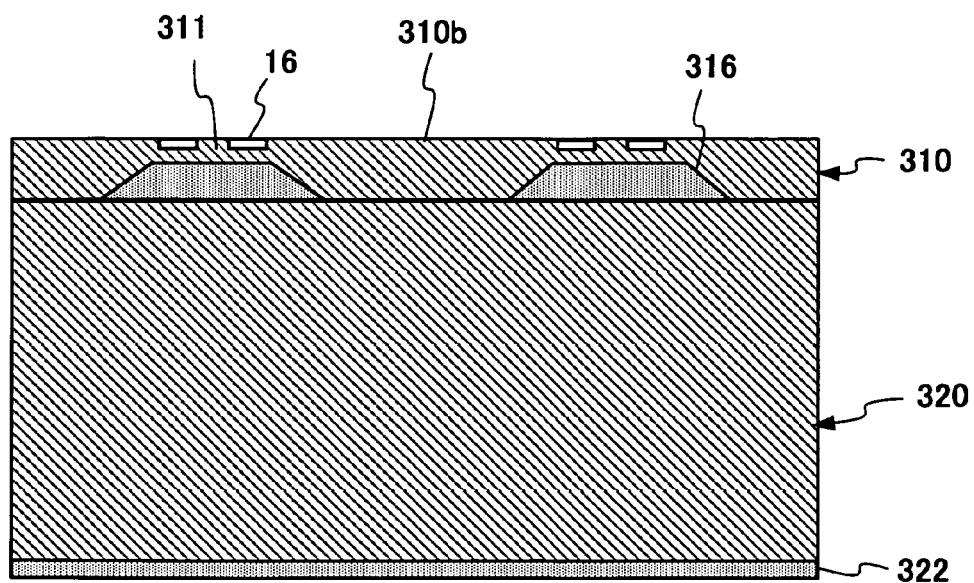

After that, the SOI substrate 300 is used for fabricating an acceleration sensor. First, as shown in FIG. 8J, piezo resistive elements 16 are formed on the thin-layer regions 311, formed on the second surface 310b of the first silicon substrate 310.

Figure 8K:
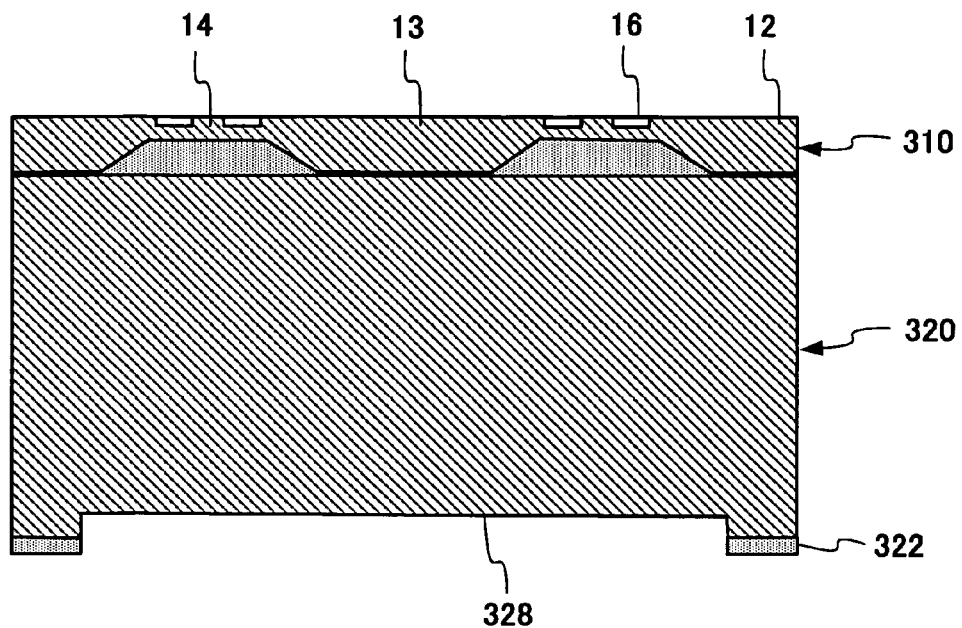
Figure 8L:
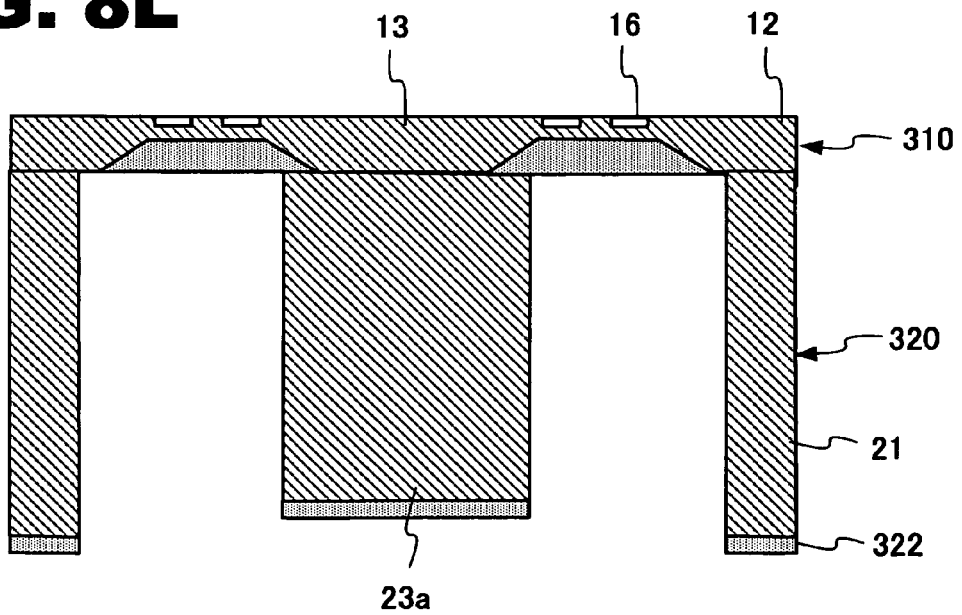

Next, as shown in FIG. 8K, the second surface 320b of the second silicon substrate 320 is reduced in thickness to form a depressed region 324. Outside of the depressed region 324 will be the frame 21. Next, as shown in FIG. 8L, mass portions 23a and 23b (not shown) are formed from the second silicon substrate 320 by photolithography process and etching process. Openings are formed on the second silicon substrate 320 to separate the beams 14 and the stopper regions 15 by photolithography process and etching process.

Figure 8M:
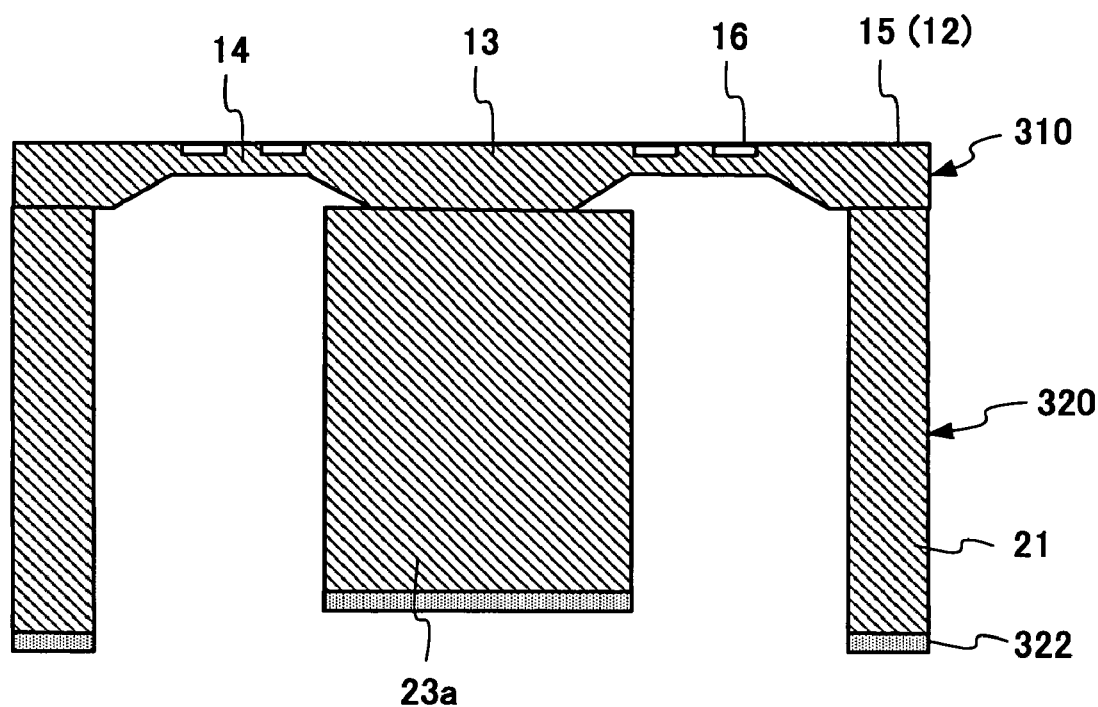

Next, the SOI substrate 300 is dipped in hydrofluoric acid to remove the insulating layer (oxide layer) 316 so that the insulating layer 316 only remains on the frames 21 and the mass 23a, as shown in FIG. 8M. After that, the SOI substrate (wafer) is diced to form individual semiconductor chips, and well known processes including packaging and wiring are carried out.

The operation of the acceleration sensor according to the present embodiment is the same as the first preferred embodiment, and is not repeated.

According to the above described second preferred embodiment, as well as the first and second preferred embodiments, the depressed regions 313 are formed on the first silicon substrate 310 before the first and second silicon substrates 310 and 320 are put (stuck) together. As a result, a surface of a completed SOI substrate 300 fabricated from those two substrates 310 and 320 is easily flattened.

Further, the beams 14 are shaped to have a smaller thickness, so that the beams 14 are easily deformed and sensitivity of acceleration is improved. On the other hand, the stopper layer 15 is formed to have a larger thickness, the stoppers 15 sufficiently strict over movement of the mass 23. That is, according to the first preferred embodiment, both improvement of sensitivity and improvement of protecting performance with the stoppers can be obtained at the same time.

The SOI substrate 300 according to the present embodiment, a surface of the active layer (310b) is flat, so that fine processing of resist patterning can be carried out. As a result, amount of resist can be reduced, so that manufacturing cost can be reduced as well. In addition, an acceleration sensor can be fabricated small in size.

In addition to the advantages of the first and second preferred embodiments, according to the present embodiment, the first and second silicon substrates 310 and 320 are directly in contact with exposed surfaces thereof, therefore, potential control between those two silicon substrate 310 and 320 is possible.

Figure 9:
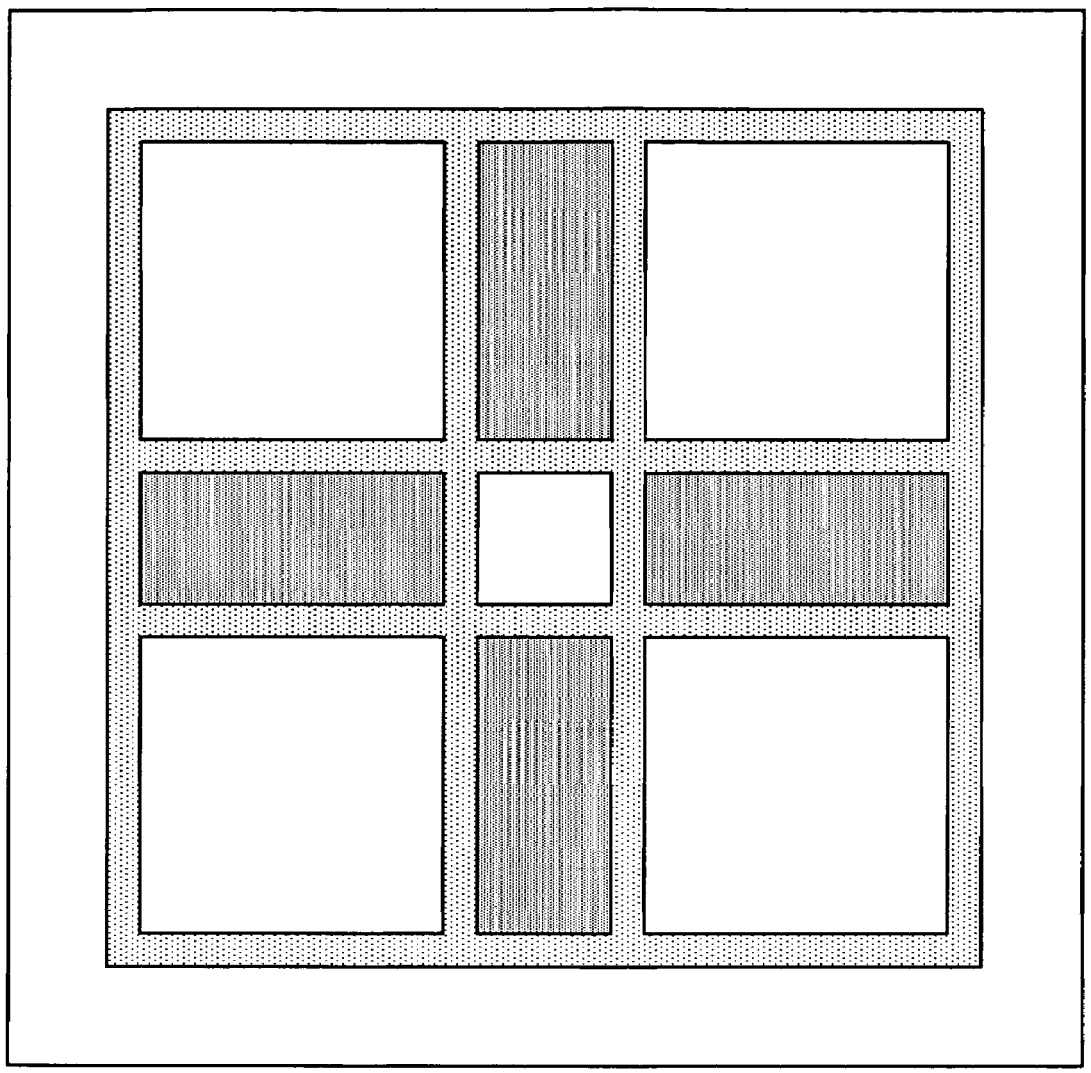
FIG. 9 is a schematic view showing layer-thickness distribution of a first silicon substrate used for fabricating a semiconductor acceleration sensor according to the present invention.

FIG. 9 is a schematic view showing layer-thickness distribution of a first silicon substrate used for fabricating a semiconductor acceleration sensor according to the present invention. As described above, the first silicon substrate (10, 110, 210 and 310) has a larger thickness at mass and stopper regions, but a smaller thickness at beams (14). The thin-layer regions (111, 211 and 311) are provided with tapered peripheral edges.

Figure 10:
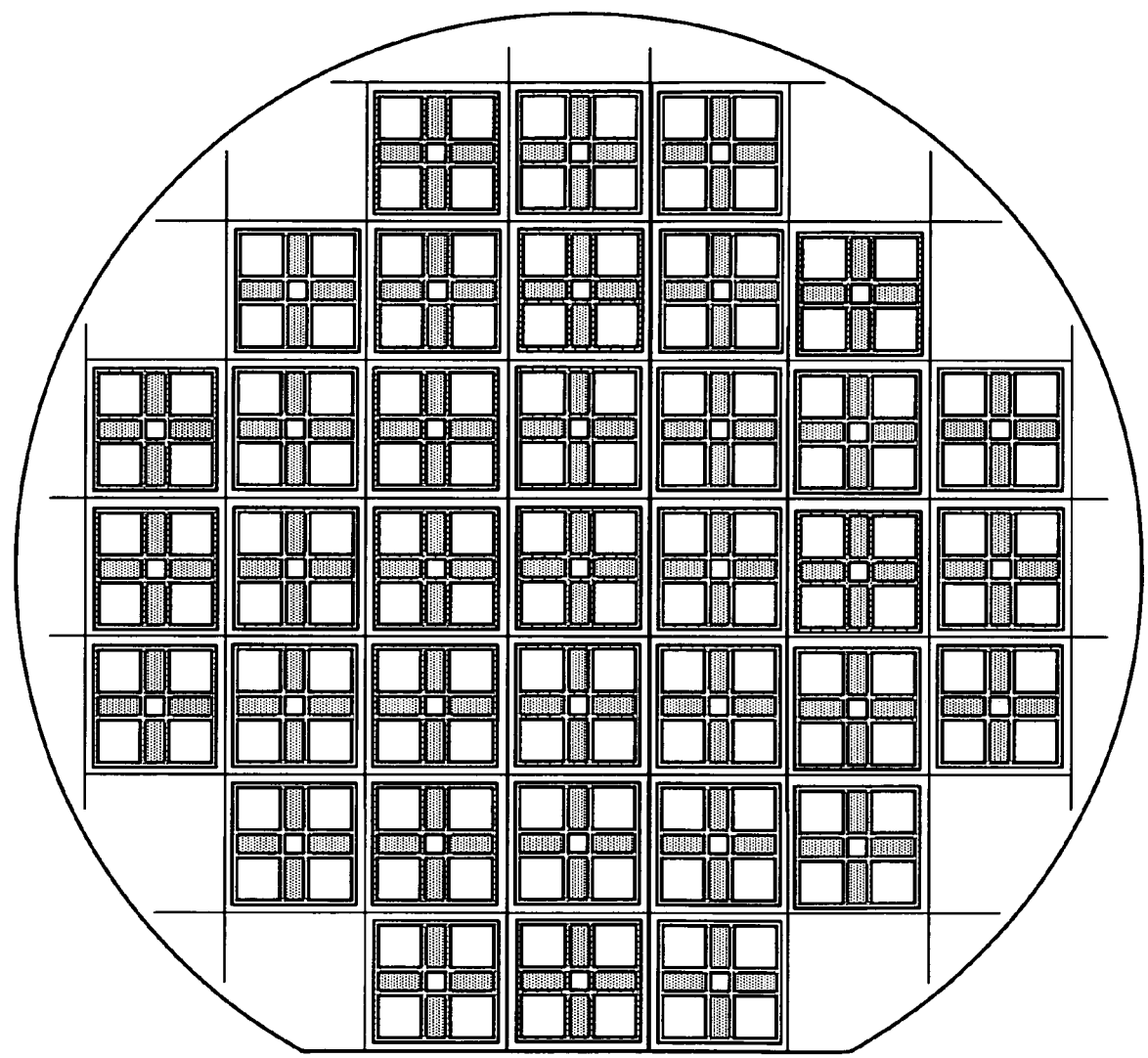
FIG. 10 is a schematic view showing layer-thickness distribution of a first silicon substrate on a wafer-state SOI substrate according to the present invention.

FIG. 10 is a schematic view showing layer-thickness distribution of a first silicon substrate on a wafer-state SOI substrate according to the present invention. Acceleration sensors are fabricated from such a SOI substrate.

What is claimed is:

1. A semiconductor acceleration sensor, in which acceleration is detected based on movement of a mass supported by beams, comprising:
   a first silicon substrate having first and second surfaces;
   a second silicon substrate having first and second surfaces; and
   a first insulating layer formed between first surface of the first silicon substrate and the first surface of the second silicon substrates, wherein
   a mass is formed from the second silicon substrate,
   beams are formed from the first silicon substrate,
   a stopper layer is formed from the first silicon substrate to restrict over movement of the mass,
   the beams have a thickness that is smaller (thinner) than that of the stopper layer.

2. A semiconductor acceleration sensor according to claim 1, further comprising:
   a second insulating layer formed on the first surface of the second silicon substrate, wherein
   the first and second silicon substrates are laminated so that the first insulating layer and the second insulating layer faces each other.

* * * * *